United States Patent
Gajula et al.

(10) Patent No.: US 12,224,014 B2
(45) Date of Patent: Feb. 11, 2025

(54) MULTI-STAGE DATA COMPACTION IN NAND

(71) Applicant: Western Digital Technologies, Inc., San Jose, CA (US)

(72) Inventors: Harish Gajula, Chilamathur (IN); Bhanushankar Doni, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 320 days.

(21) Appl. No.: 17/864,609

(22) Filed: Jul. 14, 2022

(65) Prior Publication Data

US 2024/0021249 A1 Jan. 18, 2024

(51) Int. Cl.
*G11C 16/16* (2006.01)
*G11C 16/10* (2006.01)
*G11C 16/26* (2006.01)

(52) U.S. Cl.
CPC ............ *G11C 16/16* (2013.01); *G11C 16/102* (2013.01); *G11C 16/26* (2013.01); *G06F 2212/7205* (2013.01)

(58) Field of Classification Search
None
See application file for complete search history.

(56) References Cited

U.S. PATENT DOCUMENTS

| | | |
|---|---|---|
| 8,094,500 B2 | 1/2012 | Paley et al. |
| 8,990,477 B2 | 3/2015 | Parker et al. |
| 9,530,491 B1 | 12/2016 | Uttarwar et al. |
| 10,209,914 B2 | 2/2019 | Agarwal et al. |
| 10,430,330 B2 | 10/2019 | Jain |
| 10,592,157 B2 | 3/2020 | Lin et al. |
| 2018/0247696 A1* | 8/2018 | Takizawa ............... G11C 16/10 |
| 2018/0336127 A1* | 11/2018 | Hutchison ............ G06F 12/0246 |
| 2020/0098423 A1 | 3/2020 | Huang et al. |
| 2020/0118636 A1 | 4/2020 | Athreya et al. |
| 2022/0076753 A1 | 3/2022 | Sharma et al. |

OTHER PUBLICATIONS

Jung, Sanghyuk, et al., "2LGC: An Atomic-Unit Garbage Collection Scheme with a Two-Level List for NAND Flash Storage," Department of Electronics Computer Engineering, Hanyang University, Seoul, Korea, [https://yourcmc.ru > wiki > images > e > ea > 2LGC.pdf], May 2012, 7 pages.

* cited by examiner

*Primary Examiner* — Michael Alsip
(74) *Attorney, Agent, or Firm* — Pearl Cohen Zedek Latzer Baratz LLP

(57) ABSTRACT

Technology is disclosed herein for multi-stage data compaction. In a first data compaction stage valid data fragments from source erase block(s) are programmed into a destination erase block at two bits per memory cell. In a second data compaction stage additional valid data from the source erase block(s) is programmed into the destination erase block at two bits per memory cell. In this second stage, the same physical pages of memory cells in the destination erase block may be programmed such that each memory cell in the destination erase block is programmed to four bits.

18 Claims, 18 Drawing Sheets

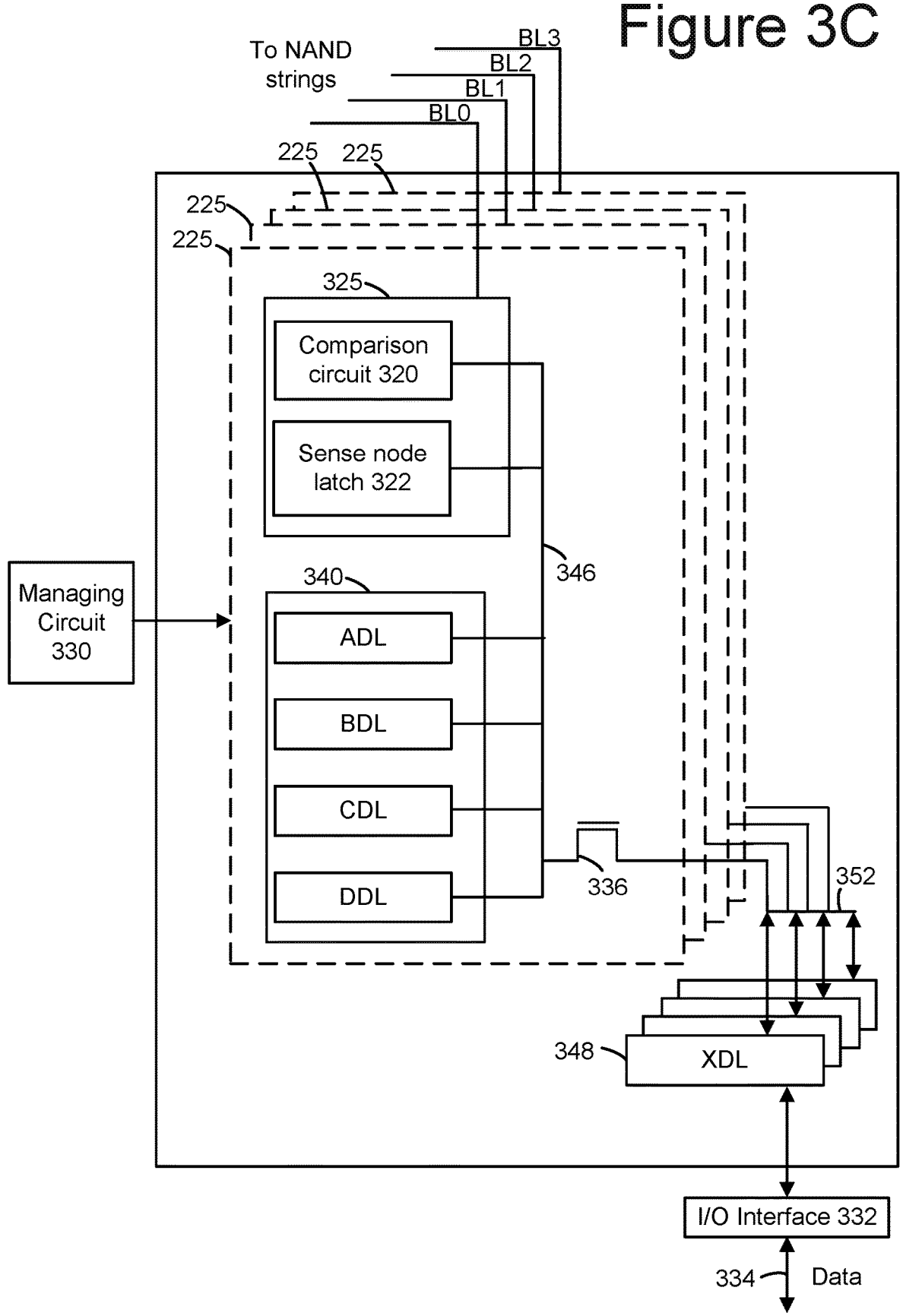

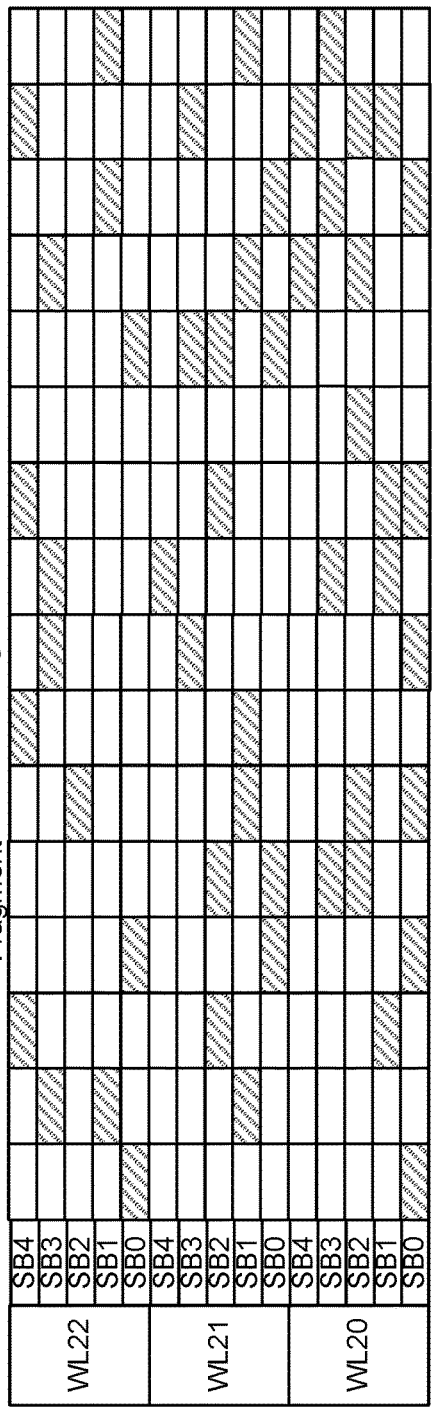
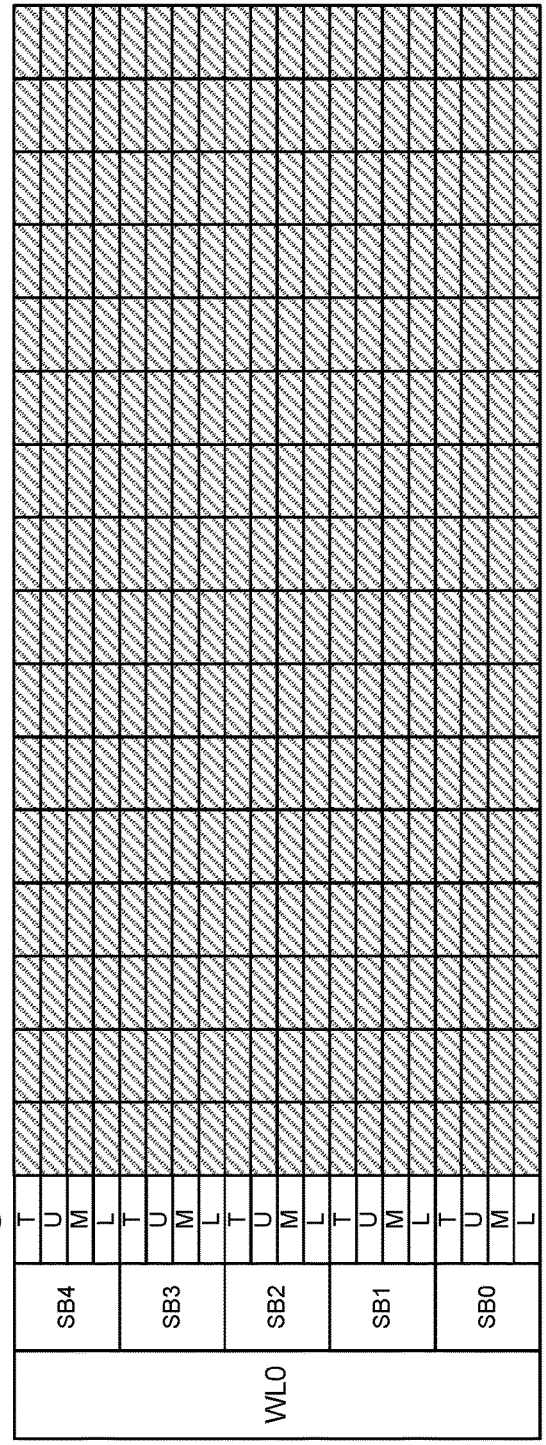
Figure 8A
Figure 8B

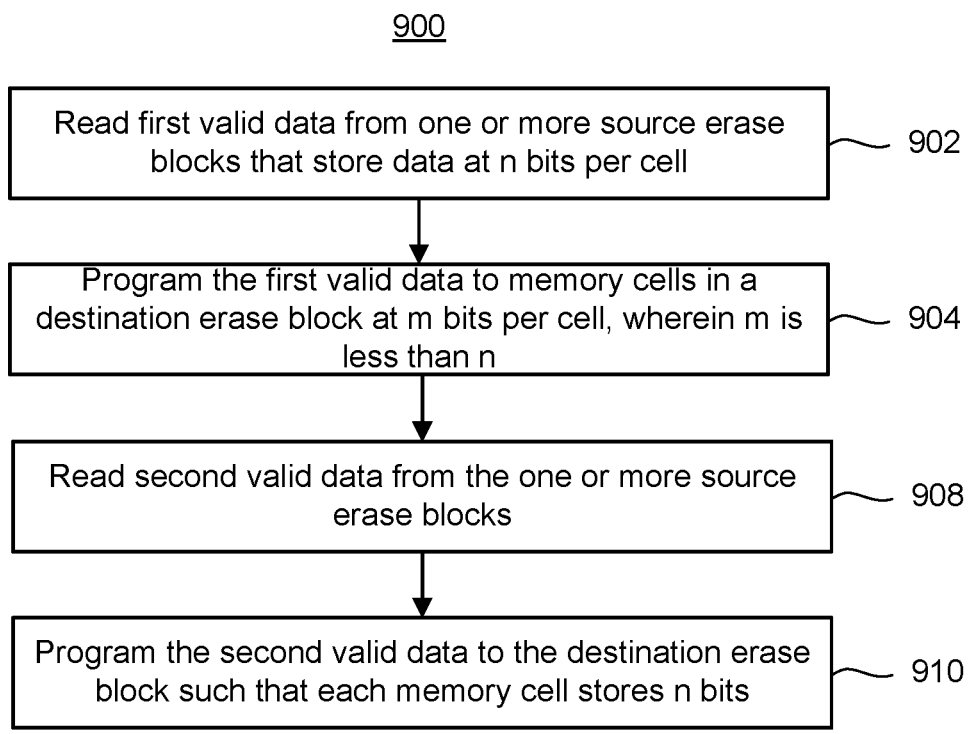

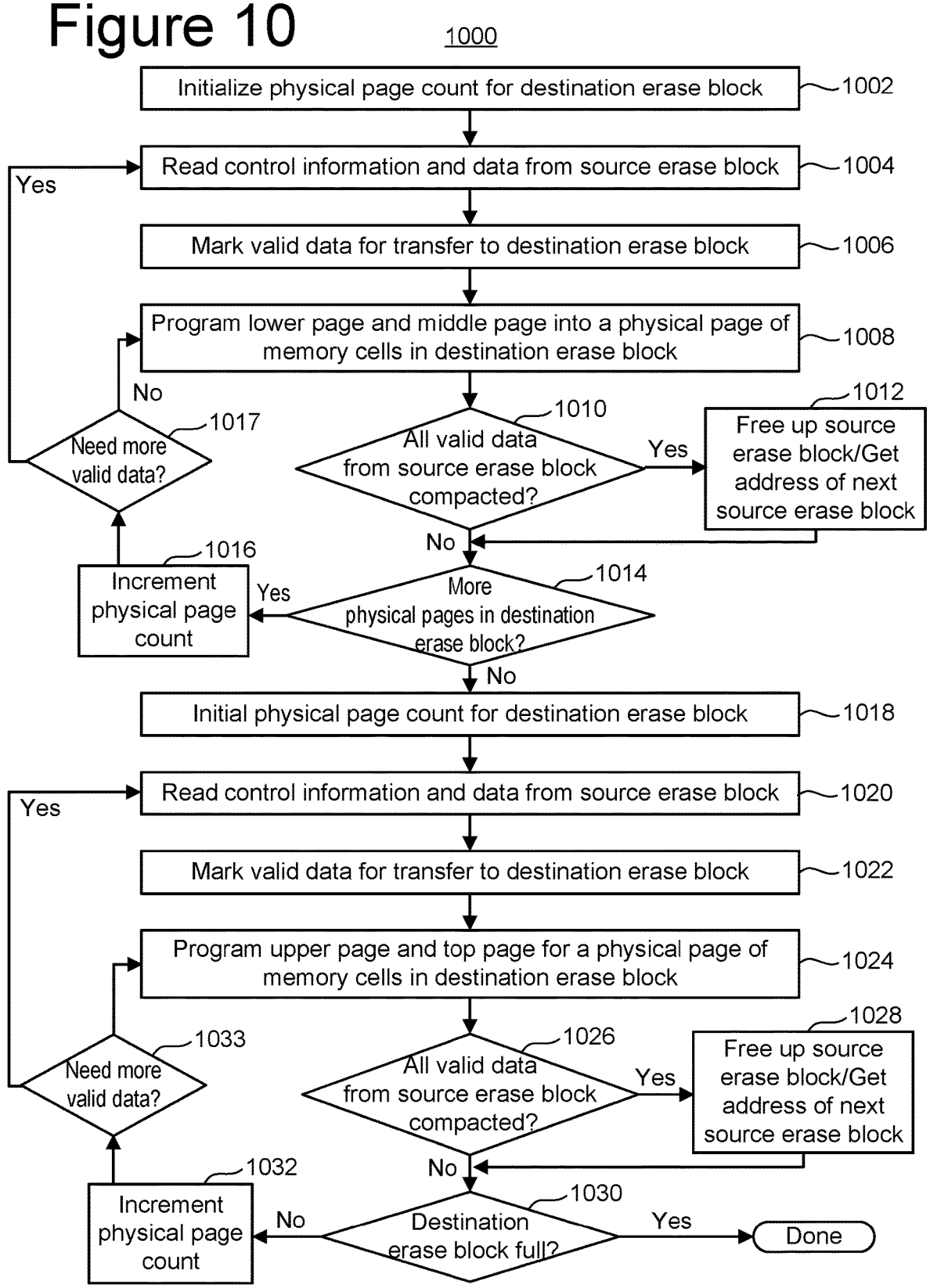

MULTI-STAGE DATA COMPACTION IN NAND

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as physical blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

For memory such as NAND, a large set of memory cells are first erased. Herein, a set of memory cells that are erased as a unit are referred to as an "erase block." In some cases an erase block coincides with a physical block. In some cases an erase block is a portion of a physical block. Then, the memory cells within the erase block are programmed one group at a time. The unit of programming is typically referred to as a physical page of memory cells. The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

In memory such as NAND, a host will request that data be stored somewhere in the memory system. However, the memory controller will decide the physical location to store the data. The host system will use logical addresses (LA) to address the various memory locations. To implement this system, the memory controller performs address translation between the logical addresses used by the host and the physical addresses (PA) used by the memory system. This allows the memory controller to move the data for various memory management reasons.

As one example, if the host updates the data for a specific LA, the memory controller may simply write the new data to a new erase block and invalidate the data stored at the original erase block. The data may remain in the original erase block until the original erase block is erased. However, the original erase block will not be erased until all of the valid data in that erase block has been moved to a new location. Data compaction is a process of moving valid data from a source erase block to a destination erase block. Data compaction is typically done when the validity percentage in the source erase block falls below a certain threshold. For example, the memory controller may select one or more source erase blocks for data compaction based on the source erase blocks having a low percentage of valid data. The valid data is moved to a destination erase block. Then, the one or more source erase blocks are freed up. For example, the one or more source erase blocks may be erased and returned to a pool of blocks that are available for programming.

Because the source erase block cannot be erased until all valid data is transferred out of the source erase block, one technique to speed up the data compaction of a source erase block that stores multiple bits per cell (MLC erase block) is to first program the valid data to one or more erase blocks at a single bit per cell ("SLC erase block). Later, the valid data is moved from the SLC source erase block to a final destination MLC erase block. However, this technique requires considerable overhead, which can hinder system performance. Moreover, the memory system has a limited number of SLC erase blocks. Therefore, this technique consumes the SLC erase block budget.

Some techniques may read the valid data into a buffer of a memory controller prior to compacting to the final destination erase block. However, the size of the data buffer in the memory controller is often quite limited. Therefore, it can be advantageous to reduce the amount of the memory controller's data buffer that is used during data compaction.

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

FIG. 7A is a diagram that shows valid and invalid data fragments in a portion of a source erase block of NAND memory cells.

FIG. 7B represents a portion of an example destination erase block that has been programmed with valid data fragments in an embodiment of the first data compaction stage.

FIG. 8A show a portion of a source erase block that contains valid data fragments that are compacted in the second data compaction stage.

FIG. 8B shows the same destination erase block from FIG. 7B, but now two additional data pages have been programmed into each physical page.

FIG. 9 is a flowchart of one embodiment of a process of two-stage data compaction.

FIG. 10 is a flowchart of one embodiment of a process of two-stage data compaction in NAND.

DETAILED DESCRIPTION

Figure 1:
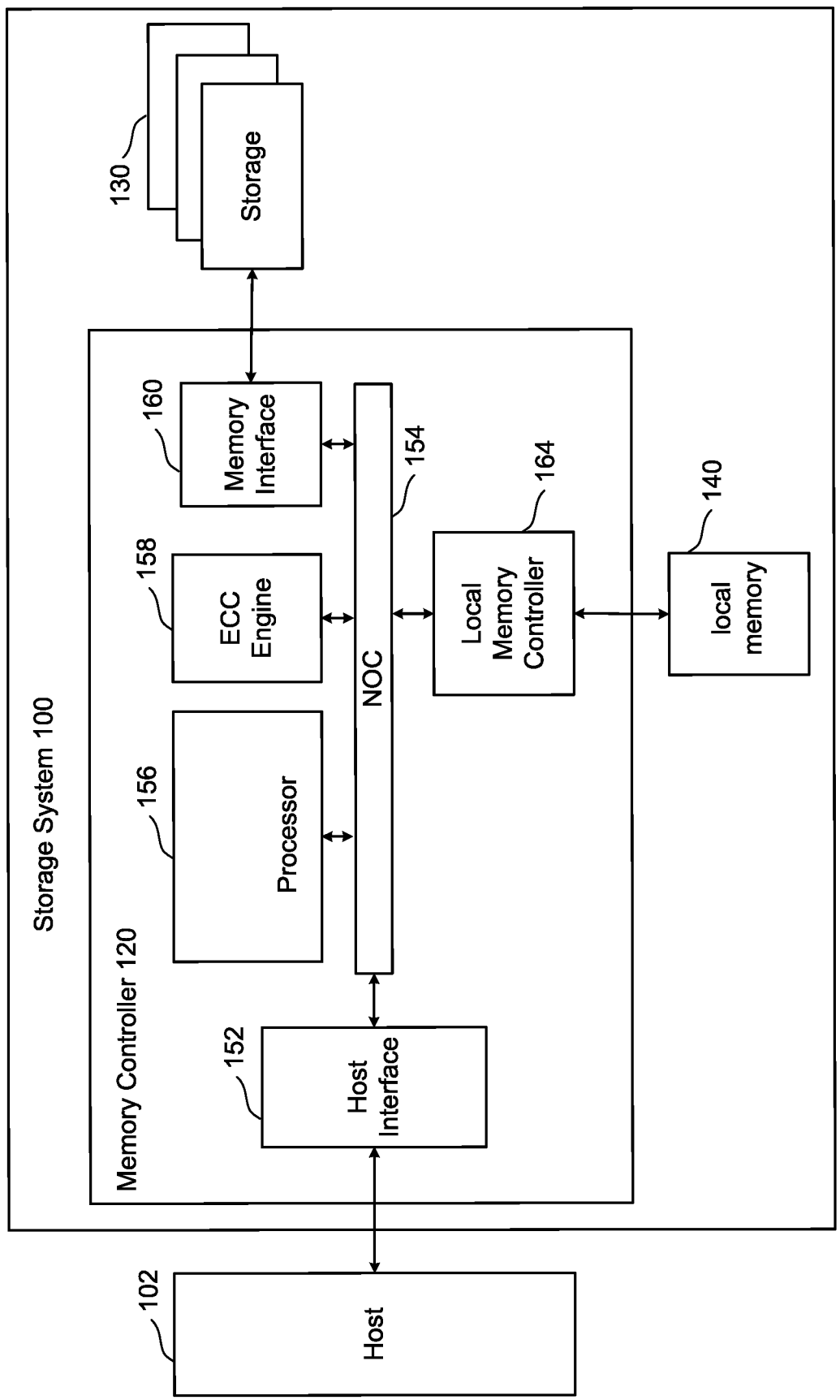
FIG. 1 is a block diagram depicting one embodiment of a storage system.

Technology is disclosed herein for multi-stage data compaction of valid data from one or more source erase blocks to a destination erase block using a multi-stage programming process. Herein the term "source erase block" refers to the source of the valid data to be moved to a "destination erase block." In an embodiment, in a first stage of data compaction the memory system collects valid data fragments from one or more source erase blocks, which are programmed into a destination erase block at two bits per memory cell. For example, two pages of valid data may be programmed into a physical page of memory cells in the destination erase block. This first stage of data compaction may be repeated to program a number of physical pages of memory cells in the destination erase block. Optionally, all physical pages of memory cells in the destination erase block can be programmed with two pages of valid data. Then, in a second stage of data compaction the memory system programs additional valid data into the destination erase block at two bits per memory cell. In this second stage, the same physical pages of memory cells in the destination erase block may be programmed such that each memory cell in the destination erase block is programmed to four bits. For example, the physical pages of memory cells in the destination erase block may each store four pages of valid data. Although the foregoing example programs two pages at a time in the first stage and two additional pages at a time in the second stage, the first and second stages could program more or fewer than two pages at a time.

In at least some cases, all of the valid data from at least one of the source erase blocks will be moved to the destination erase block during the first stage of data compaction. Therefore, these source erase blocks may be released in the first data compaction stage. Moreover, the programming that is used in the first stage of data compaction may be considerably faster than the programming that is used in the second stage of data compaction. Therefore, the source erase blocks can be freed up quickly.

Furthermore, both stages of the two-stage data compaction may program to the same destination erase block. Therefore, there is no need for SLC blocks to temporarily store the valid data from a source erase block prior to programming the valid data into a final destination erase block. Hence, an embodiment of two-stage data compaction does not consume the SLC erase block budget. Furthermore, performance is improved due to avoiding the time to program the SLC erase block.

Moreover, the memory controller's data buffer is used efficiently in an embodiment of two-stage data compaction. In one embodiment in which the source erase block stores four bits per memory cell, the first data compaction stage programs two bit per memory cell in the erase block. This valid data may be read from the source erase block to the memory controller's data buffer; therefore, only programing two bits per memory cell in the first stage reduces the amount of the memory controller's data buffer used in the first stage. In an embodiment of the second stage, two additional bits per memory cell are programmed into the same physical pages in the destination erase block. These two additional bits per memory cell may be transferred from the memory controller's data buffer to data latches associate with the physical pages of memory cells. However, as will be explained in more detail below, an internal data load may be performed of the valid data from the first stage from a particular physical page of memory cell to the data latches in order to avoid the need to have the memory controller's data buffer retain the valid data from the first stage. Therefore, the two-stage data compaction makes efficient use of the memory controller's data buffer.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals.

A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In one embodiment, the memory controller 120 performs multi-stage data compaction of the data stored storage 130. In one embodiment, the memory controller 120 uses a portion of local memory 140 as a data buffer when performing data compaction. For example, the memory controller 120 may read in valid data fragments (possibly with some invalid data fragments) from one or more source erase blocks in storage 130 and collect the valid data fragments in the data buffer in local memory 140. The memory controller 120 may then transfer valid data fragments from the data buffer to the storage 130 to be programmed into a destination erase block. Embodiments of two-stage data compaction efficiently use the data buffer in local memory 140, thereby allowing more of the local memory 140 to be used for other purposes.

Figure 2A:
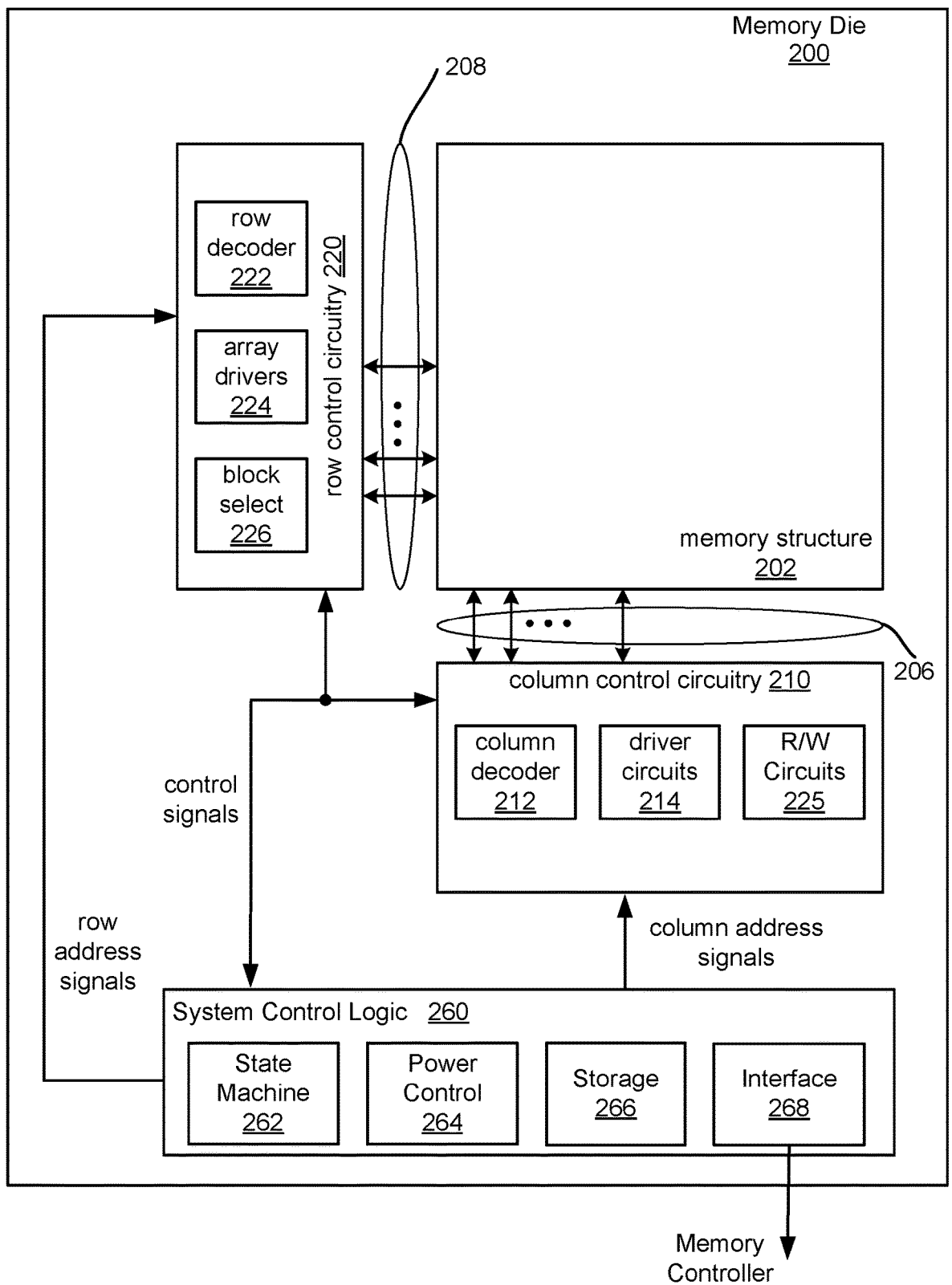
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
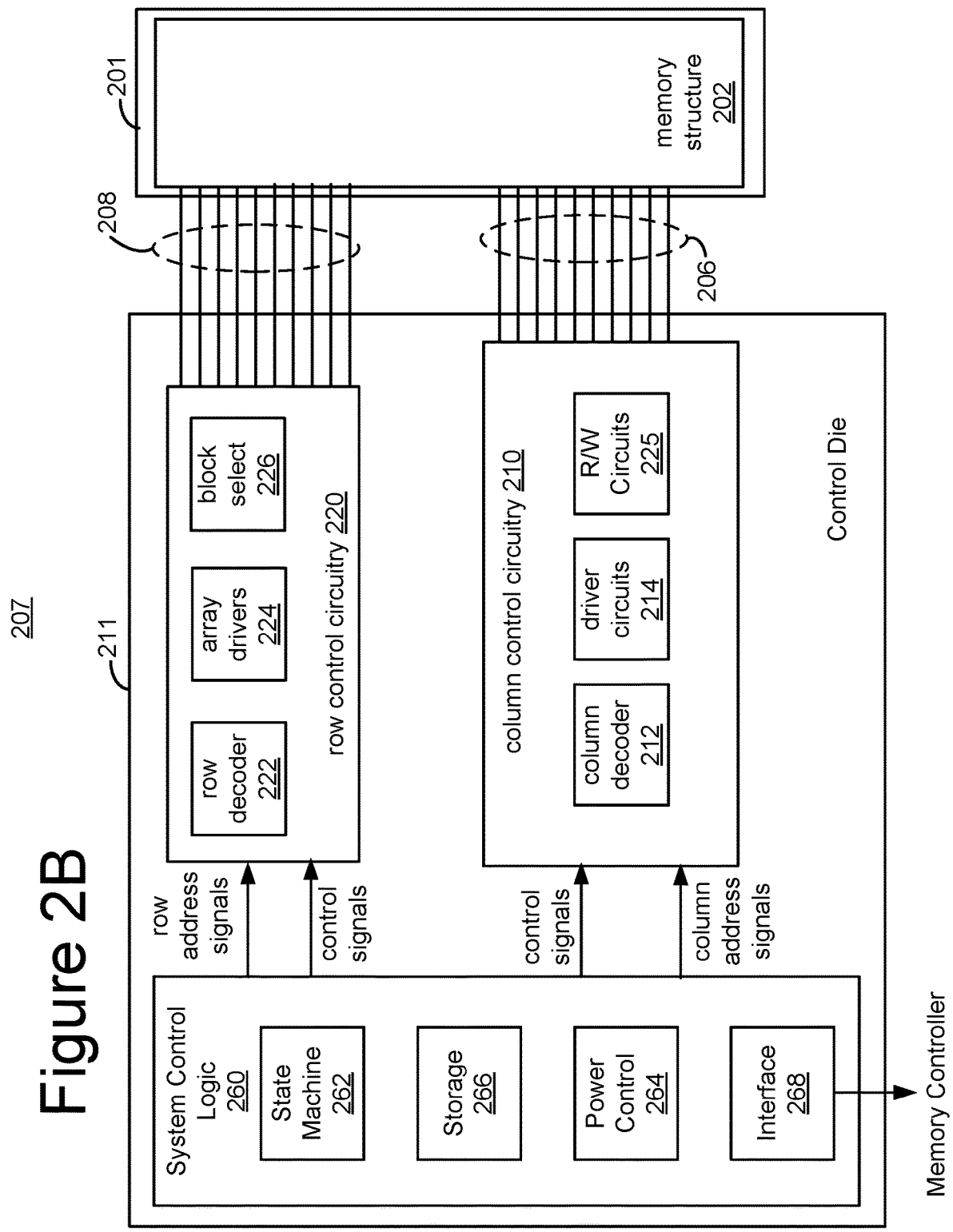
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
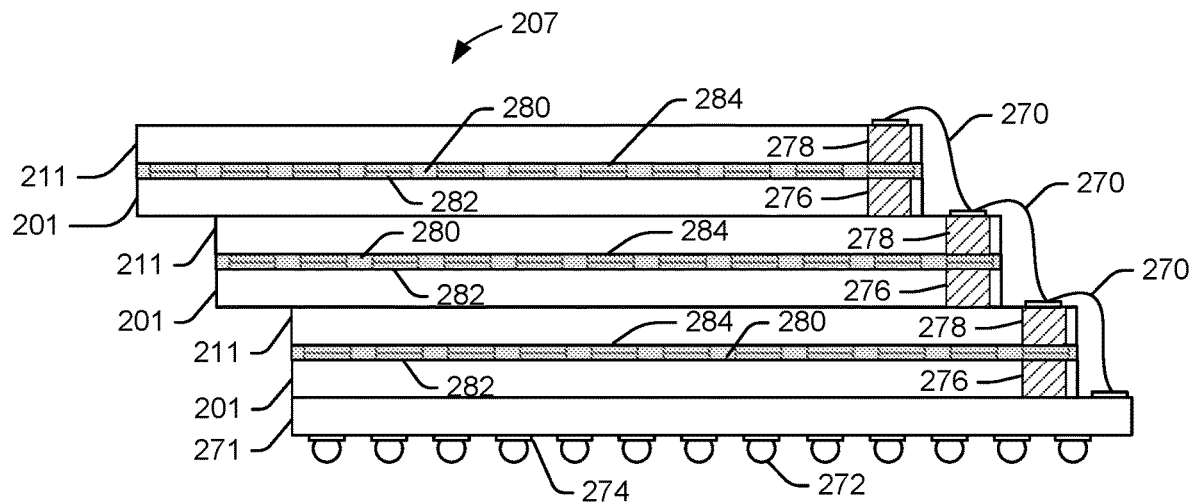
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
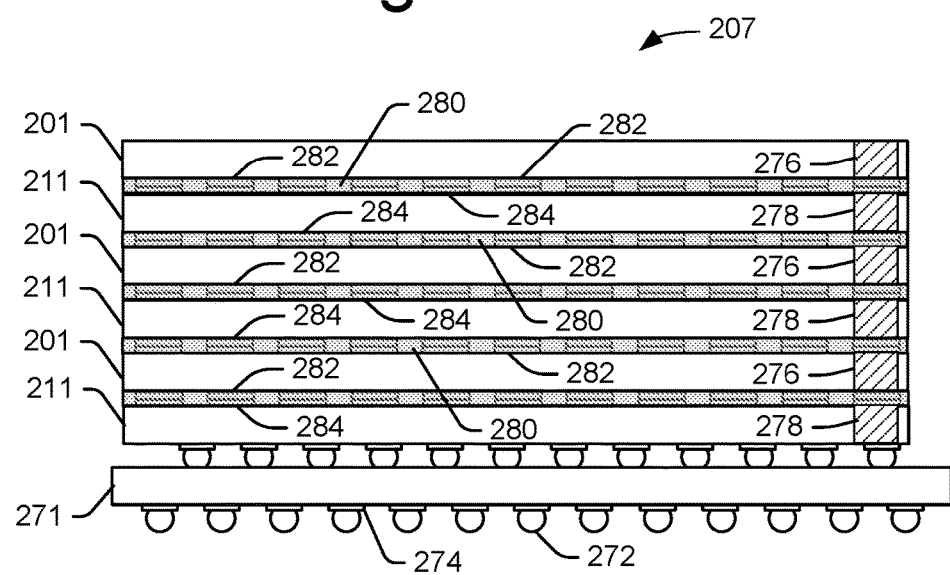

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include four latches (ADL, BDL, CDL, DDL) for each sense amplifier 325 in this example. More or fewer than four latches may be included in the data latches 340. In one embodiment, for programming each data latch 340 is used to store one bit to be stored into a memory cell and for reading each data latch 340 is used to store one bit read from a memory cell. In a four bit per memory cell embodiment, ADL stores a bit for a lower page of data, BDL stores a bit for a middle page of data, CDL stores a bit for an upper page of data, and DDL store a bit for a top page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller. In one embodiment, latch space is saved by not including the DDL latches, but instead using the XDL latches 348 for the top page of data. However, using the XDL latches 348 for the top page may slow programming.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
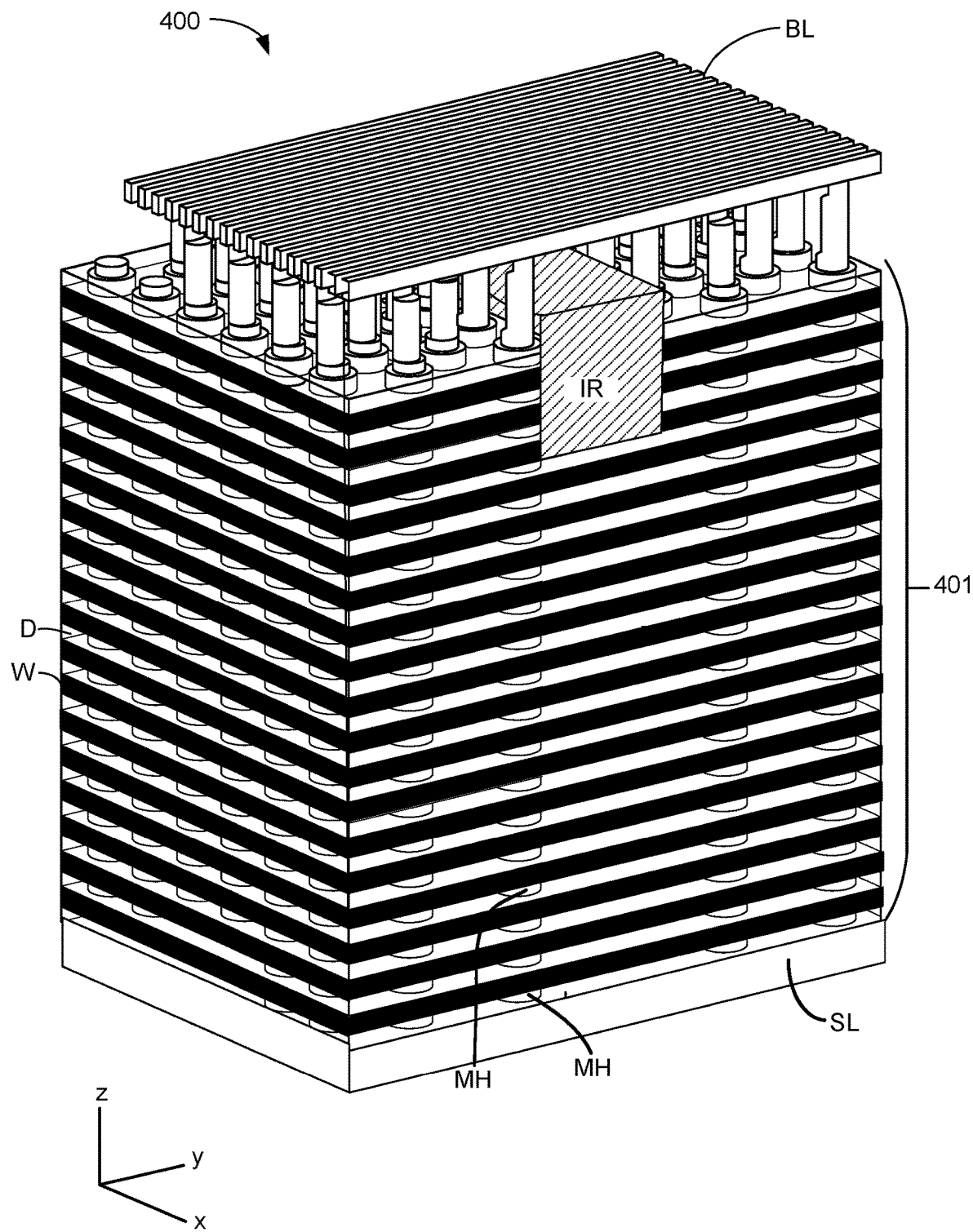
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
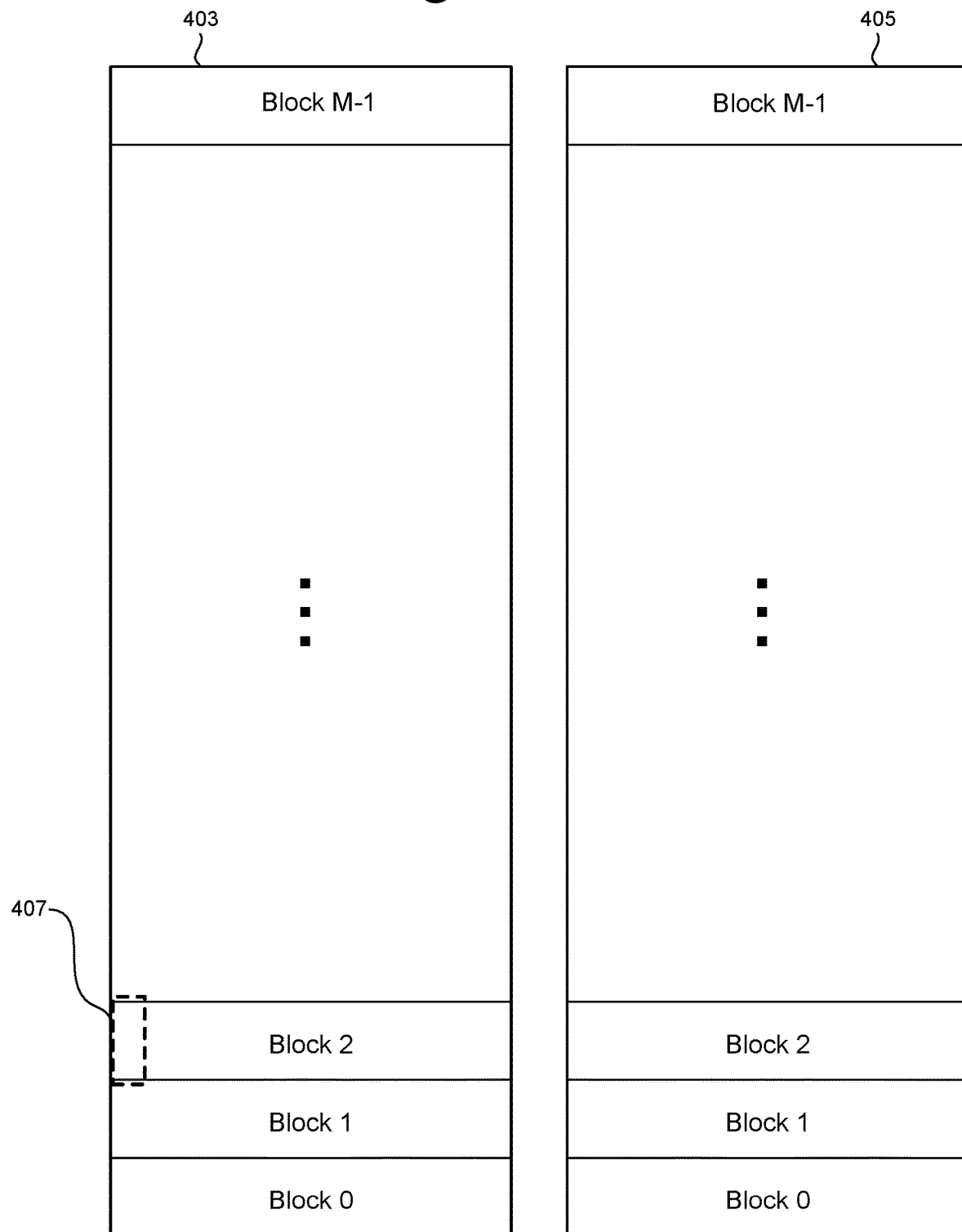
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
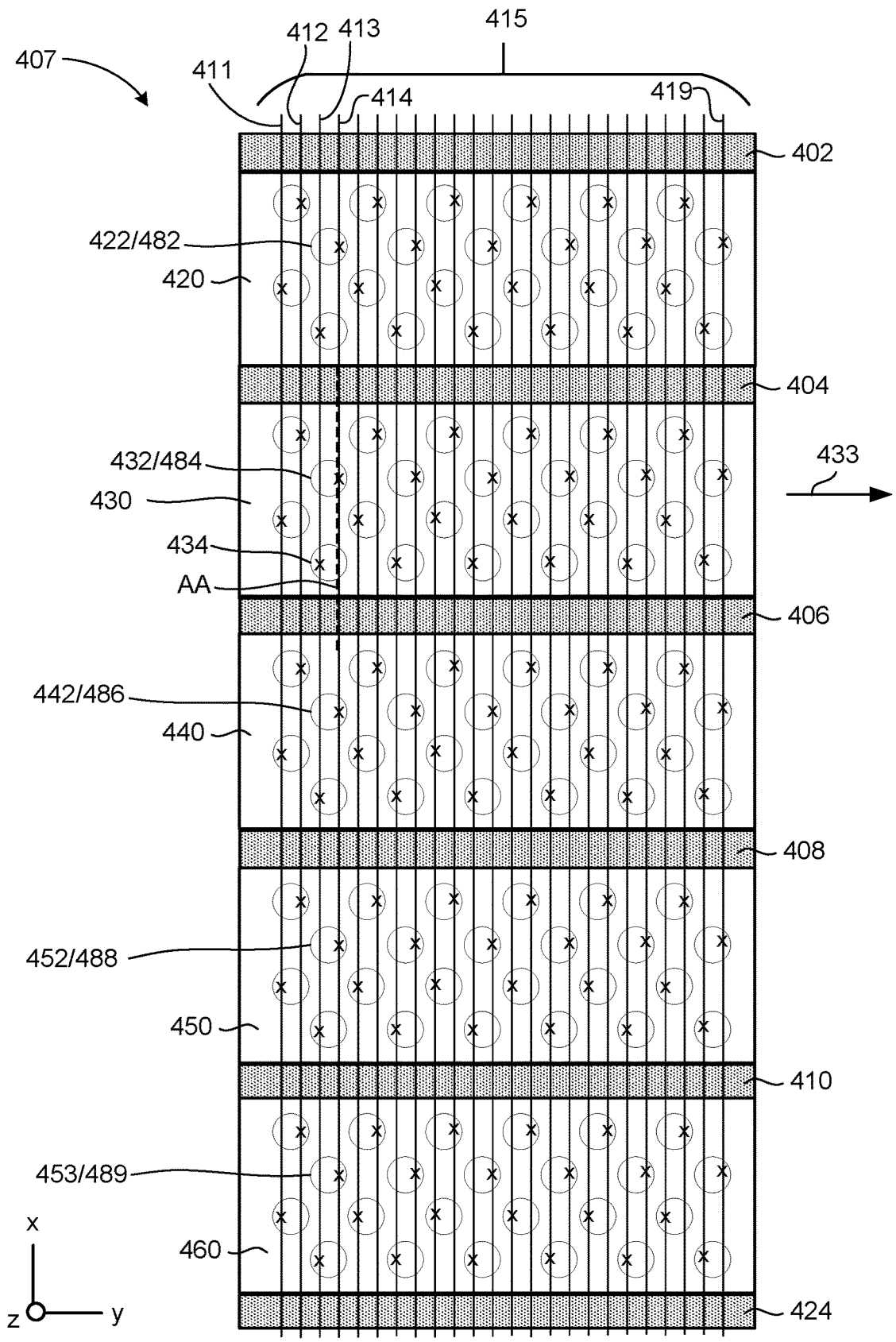
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of Sift; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
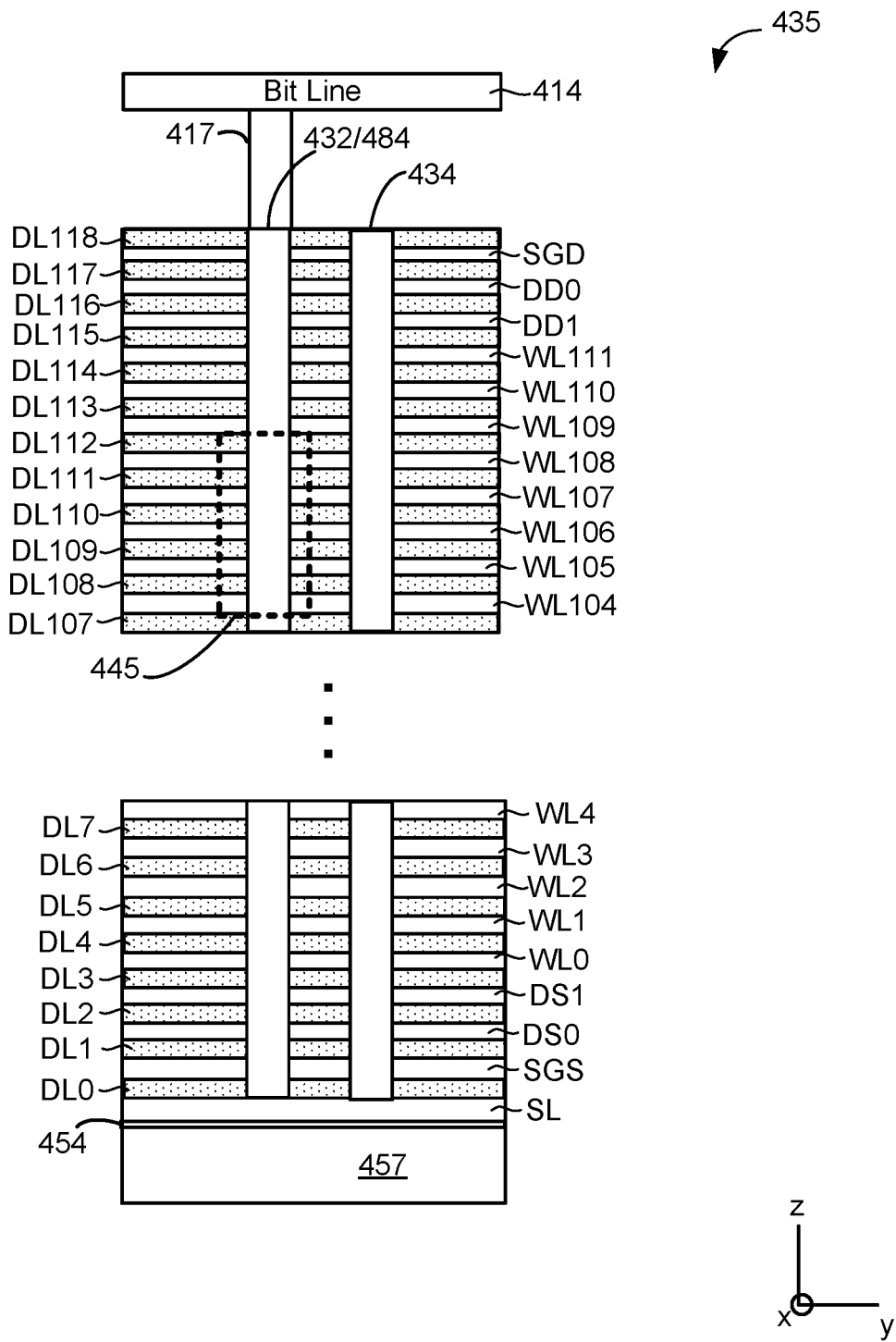
FIG. 4C depicts an embodiment of a stack showing a cross-sectional view along line AA of FIG. 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL111. Each NAND string has a drain side select transistor at the SGD layer. Each NAND string has a source side select transistor at the SGS layer. There may be more than one SGD layer, as well as more than one SGS layer. Also depicted are dielectric layers DL0-DL118.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
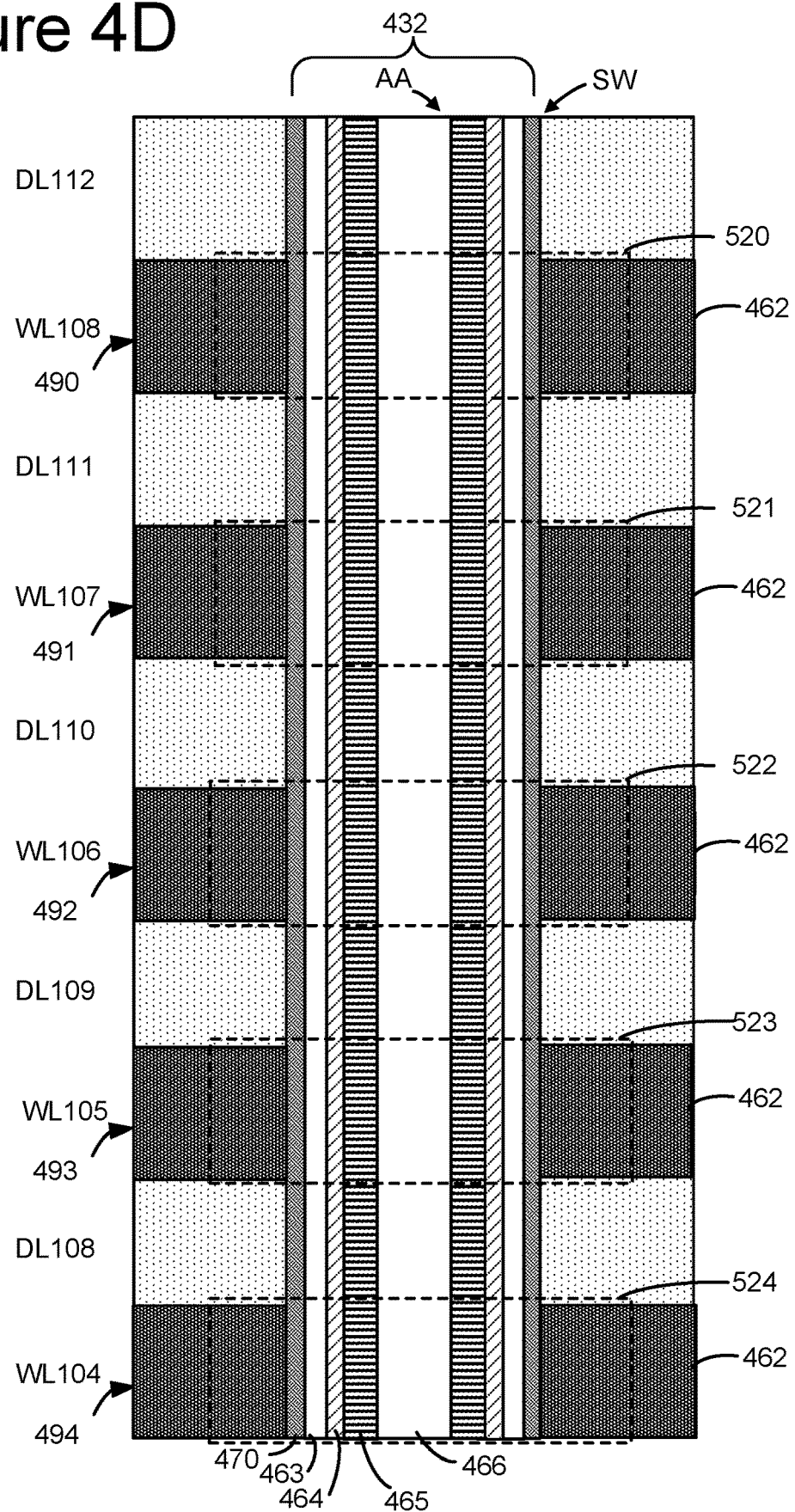
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
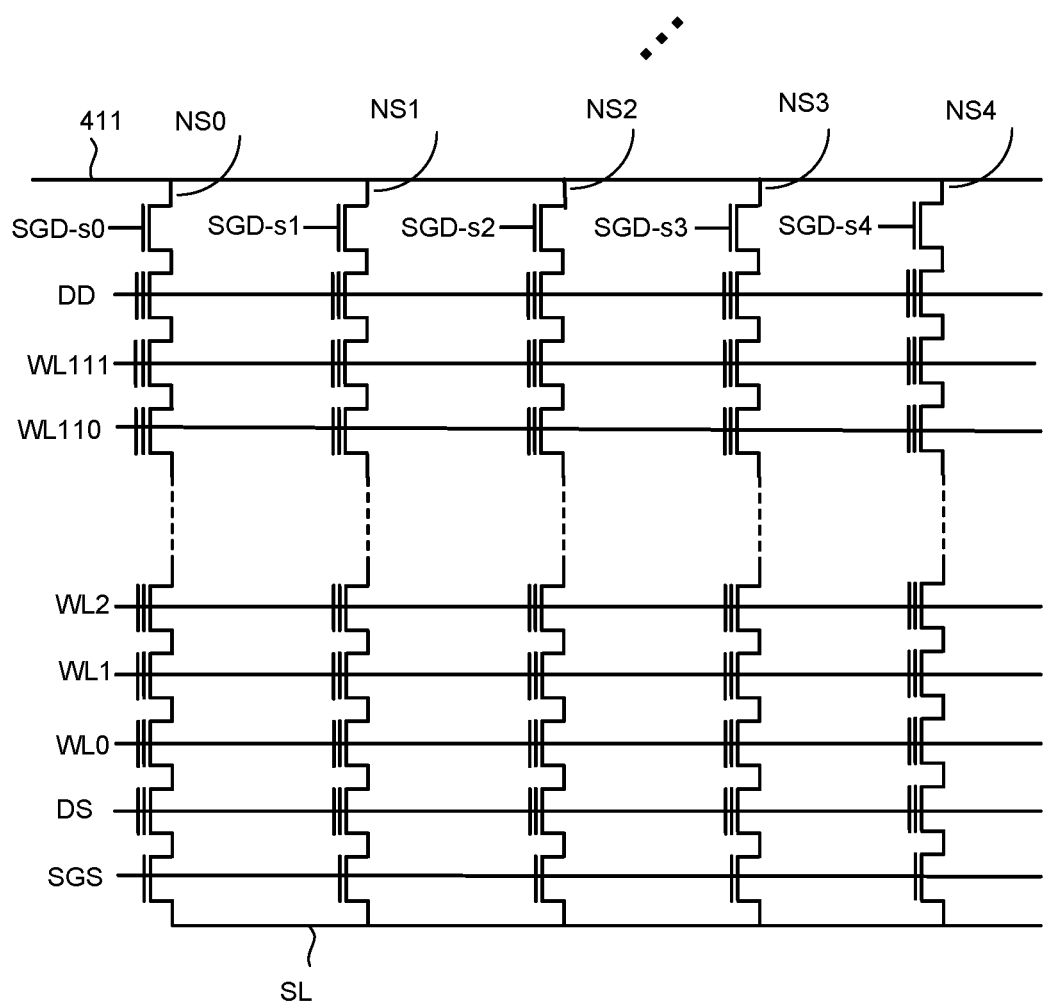
FIG. 4E is a schematic diagram of a portion of one embodiment of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line connected to NAND string NS0, NAND string NS1, NAND string NS2, NAND string NS3, and NAND string NS4.

In one embodiment, there are five drain side select lines in the physical block (SGD-s 0, SGD-s1, SGD-s2, SGD-s3, and SGD-s4). Each respective drain side select line can be selected independent of the others. Each drain side select line connects to a group of NAND strings in the block. Only one NAND string of each group is depicted in FIG. 4E. These five drain side select lines correspond to five sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other (2D and 3D) memory structures can also be used with the technology described herein.

The following terms are used herein. A physical page is a set of NAND memory cells that can be read or programmed concurrently in a physical block.

An erase block is the minimum unit of erase. An erase block contains a number of physical pages of memory cells. An erase block contains a number of word lines. An erase block may be divided into sub-blocks, which may be individually selected by different drain side select lines.

A data page is defined herein as the amount of data stored in a physical page of memory cells when each memory cell contains one bit. Thus, each memory cell in a physical page will be programmed with one bit of a data page. Because each memory cell can be programmed to more than one bit, a physical page of memory cells can store multiple data pages. For example, four data pages can be stored into a physical page of memory cells by programming four bits into each memory cell.

A logical sector is a unit of data (typically 512 Bytes) that the host identifies by an LBA.

An ECC page is formed from data bits and ECC bits, and thus can be decoded by the memory controller based only on the ECC page. The ECC page may contain a header. The header may contain a logical address of the data of the ECC page. A data page may contain more than one ECC pages. For example, a data page may contain 2, 4, or 8 ECC pages.

Figure 5:
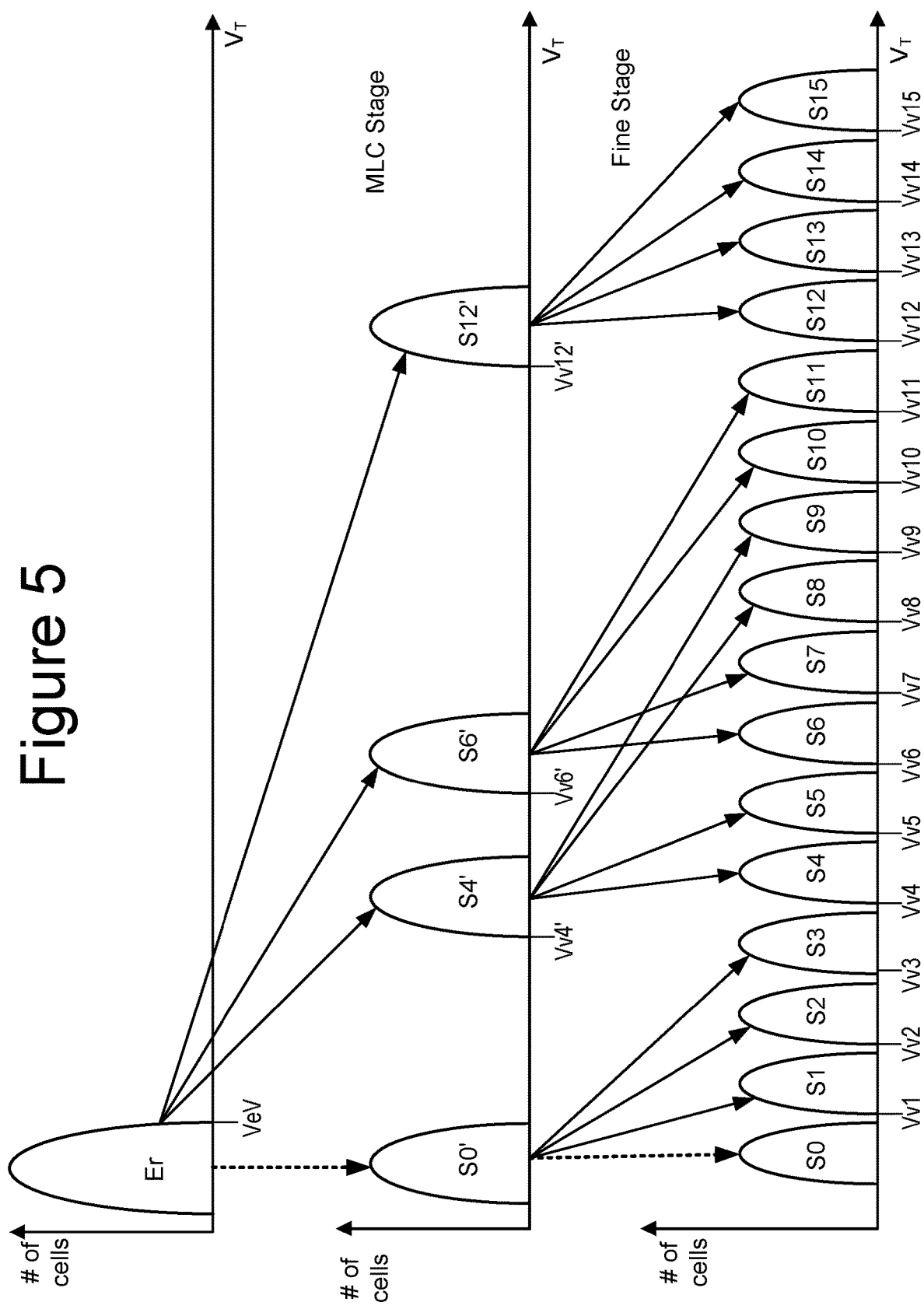
FIG. 5 depicts threshold voltage distributions during an embodiment of multi-stage data compaction.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5 depicts a threshold voltage (Vt) distributions in a multi-stage programming process, which may be used in an embodiment of multi-stage data compaction. FIG. 5 depicts Vt distributions for a physical page of memory cells that are programmed as a unit. In one embodiment, the physical page of memory cells includes those cells in a sub-block that are connected to the same word line.

Initially, a large group of memory cells that contains many physical pages of memory cells is erased. In in embodiment, an entire physical block of memory cells are erased together. However, in some cases only a portion of the physical block of memory cells are erased together. The erase distribution (Er) for a physical page of memory cells is depicted in FIG. 5. FIG. 5 depicts a two-stage programming process in which two data pages are programmed in the first stage (or MLC stage) and two additional data pages are programmed in the second stage (or fine stage). A data page has one bit for each memory cell in the physical page. The data page itself may contain one or more ECC codewords. An ECC codeword is a unit that contains a number of parity bits and a number of ECC bits. In the example in FIG. 5, the MLC stage is used to program a lower page and a middle page into the physical page of memory cells. The four states (S0', S4', S6', and S12') correspond to the four possible bit patterns for two bits. Each memory cell will be programmed in the MLC stage to one of the four states (S0', S4', S6', or S12') depending on which lower page bit and which upper page bit are stored in that cell. Memory cells to be programmed to the S4' state are verified using verify reference voltage Vv4'. Memory cells to be programmed to the S6' state are verified using verify reference voltage Vv6'. Memory cells to be programmed to the S12' state are verified using verify reference voltage Vv12'. Memory cells that are targeted for the S0' state do not receive any programming in the MLC stage. Thus, there is no need to perform any verification for such cells.

In the example in FIG. 5, the fine programming stage is used to program an upper page and a top page into the physical page of memory cells. Memory cells that were in the S0' state are either programmed to one of the three data states (S1, S2, S3) or are do not receive any programming such that they target the S0 state. Verify reference voltage Vv1, Vv2, and Vv3 are used to verify for the three respective data states (S1, S2, S3). Memory cells that were in the S4' state are programmed to one of the four data states (S4, S5, S8, S9). Verify reference voltage Vv4, Vv5, Vv8, and Vv9 are used to verify for the four respective data states (S4, S5, S8, S9). Memory cells that were in the S6' state are programmed to one of the four data states (S6, S7, S10, S11).

Verify reference voltage Vv6, Vv7, Vv10, and Vv11 are used to verify for the four respective data states (S6, S7, S10, and S11). Memory cells that were in the S12' state are programmed to one of the four data states (S12, S13, S14, S15). Verify reference voltage Vv12, Vv13, Vv14, and Vv15 are used to verify for the four respective data states (S12, S13, S14, and S15).

There are many alternatives to the sequence in FIG. 5. For example, the mapping of states from the MLC stage to the fine stage has other possibilities than depicted in FIG. 5. Also, other verify levels could be used for the MLC stage.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5, after the MLC stage each memory cell stores two bits of data. In the example embodiment of FIG. 5, after the fine stage each memory cell stores four bits of data.

Figure 6:
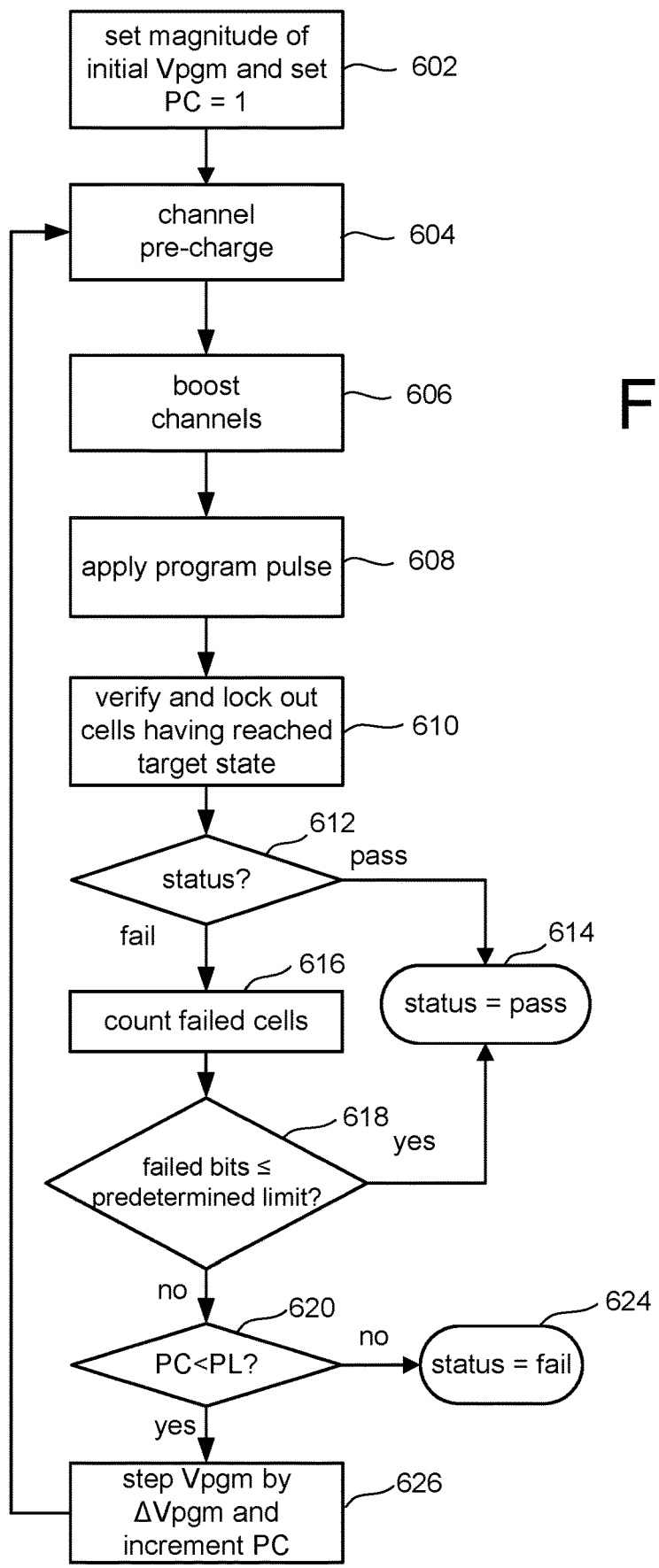
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 may be performed to implement the multi-stage programming depicted in FIG. 5. When implementing multi-stage programming, the process of FIG. 6 is used to implement any/each stage of the multi-stage programming process. For example, the process of FIG. 6 could be performed once to perform the MLC stage and again to perform the fine stage of FIG. 5.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In some embodiments, the magnitude of the verify reference voltages will depend on whether programing will result in an open block. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Figures 7A, 7B:
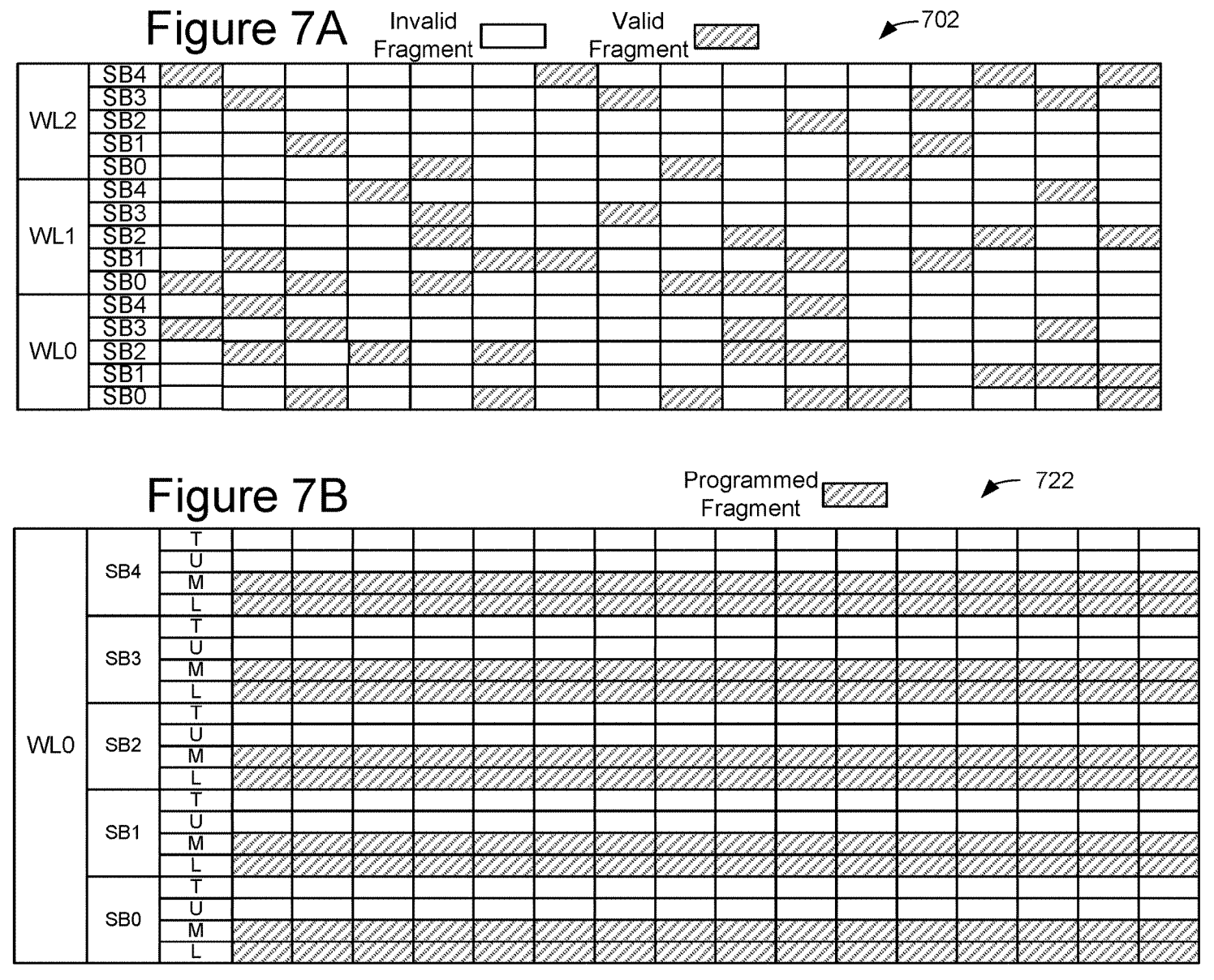

Technology is disclosed herein for a memory system that performs multi-stage data compaction. FIG. 7A is a diagram that shows valid and invalid data fragments in a portion of a source erase block 702 of NAND memory cells. The erase block is referred to herein as a "source erase block" as it is the source of the valid data to be moved to a "destination erase block." FIG. 7A shows a portion of the source erase block 702 that has three word lines (WL0, WL1, WL2). Each word line is divided into five sub-blocks in this example (SB0, SB1, SB2, SB3, SB4). In one embodiment, the memory cells that are connected to the same word line in a sub-block form one physical page of memory cells. Thus, there are 15 physical pages of memory cells represented in FIG. 7A. The physical page of memory cells may store one or more data pages, depending on how many bits are stored per memory cell. An example will be discussed in which each memory cell stores four bits, and thus the physical page of memory cells stores four data pages. Thus, the 15 physical pages of memory cells represented in FIG. 7A may store, for example, 60 data pages. A data fragment may be smaller than a data page. Hence, there may be more than one data fragment per data page.

In an embodiment, the memory system will collect valid data fragments from one or more source erase blocks 702 and move that valid data fragments to a destination erase block. In one embodiment, the memory controller 120 collects the valid data fragments in a data buffer in the local memory 140. However, the invalid data fragments from the source erase block 702 are not moved to the destination erase block. Therefore, the data is compacted. In an embodiment, the data compaction has two stages. In an embodiment, the first stage involves programming the valid data fragments at two bits per memory cell in the destination erase block. FIG. 7B represents a portion of an example destination erase block 722 that has been programmed with valid data fragments in an embodiment of the first data compaction stage. The portion of the example destination erase block 722 contains one word line (WL0). Many more word lines in the destination erase block 722 may be programmed in the first data compaction stage, but only WL0 is depicted. In one embodiment, all of the word lines in the destination erase block 722 are programmed in the first data compaction stage. Consistent with the example in FIG. 7A, there are five sub-blocks (SB0, SB1, SB2, SB3, SB4) in the destination erase block 722. In the first data compaction stage two data pages are programmed into a physical page of memory cells in the destination erase block 722. FIG. 7B represents five physical pages. For example, the memory cells in SB0 connected to WL0 form one physical page, the memory cells in SB1 connected to WL0 form a second physical page, etc. Each physical page is programmed with a lower data page (L) and a middle data page (M) in the example represented in FIG. 7B. During the second stage of the data compaction an upper data page (U) and a top data page (T) will be programmed into each physical page.

FIG. 8A show a portion of a source erase block 802 that contains valid data fragments that are compacted in the second data compaction stage. FIG. 8B shows the same destination erase block 722 from FIG. 7B, but now two additional data pages have been programmed into each physical page. Specifically, the upper data page (U) and the top data page (T) have been programmed into each of the five physical pages.

FIG. 9 is a flowchart of one embodiment of a process 900 of two-stage data compaction. The process compacts data stored in one or more source erase blocks at n bits per cell. After both data compaction stages are complete, memory cells in the destination erase block will store valid data at n bits per cell. However, after the first data compaction stage, the memory cells in the destination erase block will store the valid data at m bits per cell where m is less than n. In one embodiment, n is four and m is two. For example, in the first data compaction stage two data pages are stored into each physical page in the destination erase block. Then, in the second data compaction stage two additional data pages are stored into the same physical pages in the destination erase block. The first data compaction stage is very fast because programming the memory cells at two bits per cell may be much faster than programming memory cells to four bits per cell. This allows freeing of a source erase block for which all valid data has been compacted to the destination erase block.

Step 902 includes reading first valid data from one or more source erase blocks that store data at n bits per memory cell. In an embodiment, step 902 includes reading control information from the one or more source erase blocks that is used determine which of the data stored in the one or more source erase blocks is valid. The valid data may be read and transferred to the memory controller 120. The valid data may be stored in a data buffer in the memory controller 120. For example, the valid data may be stored in a data buffer in local memory 140. In some cases, invalid data will also be read and transferred to the memory controller 120. The invalid data may be discarded. In an embodiment, the memory controller 120 will collect at least enough valid data to program two data pages into a physical page of memory cells. For example, the memory controller 120 may collect enough of valid data fragments (see FIG. 8A) to form m data pages.

Step 904 includes programing the first valid data into memory cells in a destination erase block atm bits per cell. In one embodiment, a number of physical pages of memory cells are programmed in the destination erase block in step 904. In one embodiment, all of the physical pages in the destination erase block are programmed in step 904. Thus, step 904 may include the memory controller 120 sending valid data from the data buffer in the memory controller 120 to the control die 211 or the memory die 200. The system control logic 260 programs the valid data in the physical pages in the destination erase block. For example, the system control logic 260 may perform the process of FIG. 6 to program m data pages into each of the physical pages of memory cells. More specifically, the process of FIG. 6 may be performed separately for each of the physical pages in the destination erase block. Note that steps 902 and 904 may be interleaved. That is, additional first valid data may be read from the one or more source erase blocks after some of the first valid data has been programmed into the destination erase block.

Step 908 includes reading second valid data from the one or more source erase blocks that store data at n bits per memory cell. Step 908 may be similar to step 902. Step 910 includes programing the second valid data into memory cells in the destination erase block such that each memory cell stores n bits. In one embodiment, the same physical pages that were programmed in step 904 are programmed in step 910. Step 910 may include the memory controller 120 sending valid data from the data buffer in the memory controller 120 to the control die 211 or the memory die 200. As will be explained in further detail below, step 910 may include performing an internal data load of the first valid data from the physical pages to data latches associated with the physical pages. The system control logic 260 programs the second valid data into the physical pages of memory cells. For example, the system control logic 260 may perform the process of FIG. 6 to program n-m data pages into each of the physical pages of memory cells. More specifically, the process of FIG. 6 may be performed separately for each of the physical pages in the destination erase block. Note that steps 908 and 910 may be interleaved. That is, additional second valid data may be read from the one or more source erase blocks after some of the second valid data has been programmed into the destination erase block.

FIG. 10 is a flowchart of one embodiment of a process 1000 of two-stage data compaction in NAND. The process 1000 provides further details of one embodiment of process 900. Process 1000 describes an embodiment in which the source erase blocks store data at four bits per cell and the first data compaction stage programs valid data into the destination erase block at two bits per cell. The four data pages are referred to herein as: lower page, middle page, upper page, and top page.

Step 1002 includes initializing a physical page count for the destination erase block. The physical page count is the count of how many physical pages in the destination erase block have been programmed for the first data compaction stage. Thus, the physical page count may be initialized to zero.

Step 1004 includes reading control information and data from a source erase block. In an embodiment, ECC pages are read. In an embodiment, an ECC page contains a header that has control information, data bits, and ECC parity bits. For example, the header be 14 bytes, there may be multiple 512-Byte sectors of data, along with ECC parity bits. The control information may contain information to determine whether the data in the ECC page is valid. In one embodiment, the header contains a logical address (e.g., LBA). The memory controller 120 consult additional information such as an L2P table to determine whether data in the ECC page is valid. Step 1004 may include reading data (which may contain both valid and invalid data fragments) into a data buffer in local memory 140.

Step 1006 marking valid data for transfer to the destination erase block. Step 1006 may include collecting at least a sufficient amount of valid data into the data buffer for a lower data page and a middle page.

Step 1008 includes programming the lower page and the middle page of valid data into a physical page of memory cells in the destination erase block. Step 1008 may include the memory controller 120 transferring the lower page and the middle page to either the memory die 200 or the control die 211. The system control logic 260 may program the data. In one embodiment, step 1008 results in four Vt distributions (e.g., S0', S4', S6', S12') such as depicted in the MLC Stage of FIG. 5.

Step 1010 includes a determination of whether all valid data from the source erase block has been compacted. If so, then the source erase block may be freed in step 1012. This allows the source erase block to be erased and returned to a pool of blocks that are eligible to store data from, for example, the host. Also in step 1012 the address of the next source erase block to have its data compacted is obtained. The next source erase block may be selected based on a percentage of valid data being below a threshold.

Whether or not step 1012 is performed the next step is to determine in step 1014 whether there are more physical pages to be programmed in the destination erase block. In one embodiment, the physical page count is compared to a total number of physical pages in the destination erase block. If there are more physical pages to be programmed in the destination erase block, then the physical page count is incremented in step 1016. Step 1017 is a determination of whether more valid data is needed. If so, then the process 1000 returns to step 1004 to read more control information and more data from the source erase block. However, steps 1004-1006 may be skipped if the memory controller 120 has already read enough control information and valid data from a previous iteration. However, step 1008 is performed again to program a lower page and an upper page into another physical page of memory cells in the destination erase block. When all physical pages that are to be programmed in the first compaction stage have been programmed (step 1014 is no), then the first data compaction stage is complete. FIG. 7B depicts a representation of two data pages in each of the five physical pages on WL0 of a destination erase block after a first data compaction stage. The process 1000 then moves on to the second data compaction stage in step 1018.

Step 1018 includes initializing the physical page count for destination erase block again. The second data compaction stage will program the same physical pages that were programmed in the first data compaction stage. Thus, the physical page count may be initialized to zero.

Step 1020 includes reading control information and data from a source erase block. This source erase block may be the last source erase block that was being compacted in the first data compaction stage.

Step 1022 marking valid data for transfer to the destination erase block. Step 1022 may include collecting at least a sufficient amount of valid data into the data buffer for a upper data page and a top page.

Step 1024 includes programming an upper page and a top page of valid second stage data into a physical page of memory cells in the destination erase block. Step 1024 may include the memory controller 120 transferring the upper page and the top page to either the memory die 200 or the control die 211. However, the lower page and the middle page need not be transferred from the data buffer to the die 200 or 211. Instead an internal data load may be programmed to obtain the lower page and the middle page. In one embodiment, step 1024 results in 16 Vt distributions (S0-S15) such as depicted in the Fine Stage of FIG. 5.

Step 1026 includes a determination of whether all valid data from the source erase block has been compacted. If so, then the source erase block may be free in step 1028. Also in step 1028 the address of the next source erase block to have its data compacted is obtained.

Whether or not step 1028 is performed the next step is to determine in step 1014 whether there are more physical pages to be programmed in the destination erase block. In one embodiment, the physical page count is compared to a total number of physical pages in the destination erase block. If there are more physical pages to be programmed in the destination erase block, then the physical page count is incremented in step 1032. Step 1033 is a determination of whether more valid data is needed. If so, then the process 1000 returns to step 1020 to read more control information and data from the source erase block. However, step 1020 may be skipped if the memory controller 120 has already read enough control information and valid data from a previous iteration. However, step 1024 is performed again to program an upper page and a top page into another physical page of memory cells in the destination erase block. When all physical pages that are to be programmed in the second compaction stage have been programmed (step 1030 is no), then the second data compaction stage is complete. FIG. 8B depicts a representation of four data pages in each of the five physical pages on WL0 of a destination erase block after a second data compaction stage.

Figure 11A:
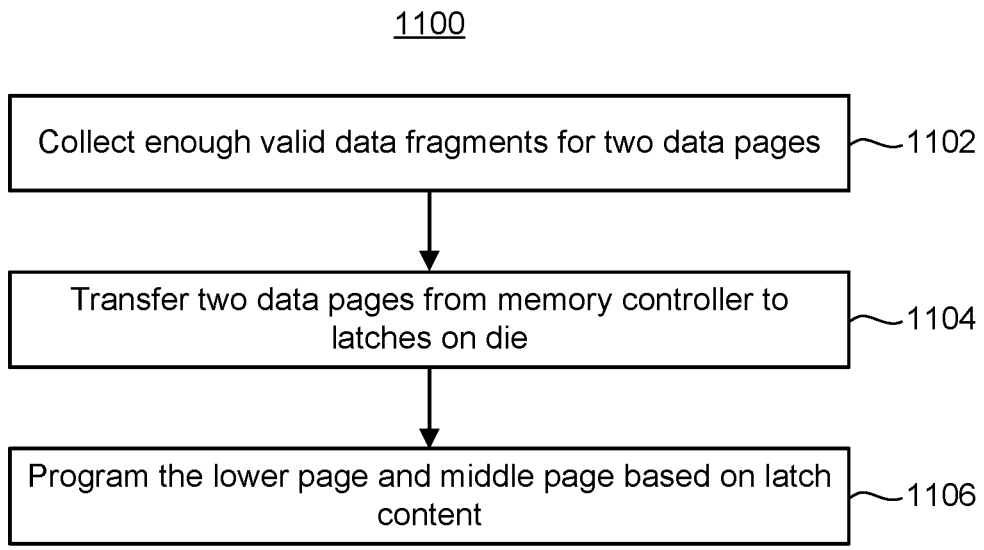
FIG. 11A is a flowchart depicting further details of one embodiment of a process of programming two data pages into a physical page of memory cells during a first-stage of multi-stage data compaction.

FIG. 11A is a flowchart depicting further details of one embodiment of a process 1100 of programming two data pages into a physical page of memory cells during a first-stage of multi-stage data compaction. The process 1100 may be used in an embodiment of step 1008 of process 1000.

Step 1102 includes collecting enough valid data fragments for two data pages. The valid data fragments may be collected in a data buffer (e.g., local memory 140) of the memory controller 120.

Step 1104 includes transferring the two data pages from the data buffer of the memory controller 120 to data latches on the memory die 200 or control die 211. In some embodiments, the valid data is transferred from local memory 140 to memory interface 160. Then, the two pages are transferred by way of I/O interface 332 to the XDL latches 348. Then, the two data pages may be transferred to the ADL and BDL latches in the set of latches 340.

Step 1106 includes programming the lower page and the upper page based on the latch content. Step 1106 may be performed under control of the state machine 262. The process of FIG. 6 may be used. In one embodiment, step 1106 includes performing the MLC stage depicted in FIG. 5. However, note that different verify levels can be used than the ones in the example in FIG. 5. Moreover, the separation between the states (S0', S4', S6', S12') may be different than the example in FIG. 5. Process 1100 may then be repeated to program lower pages and upper pages into other physical pages in the destination erase block.

Figure 11B:
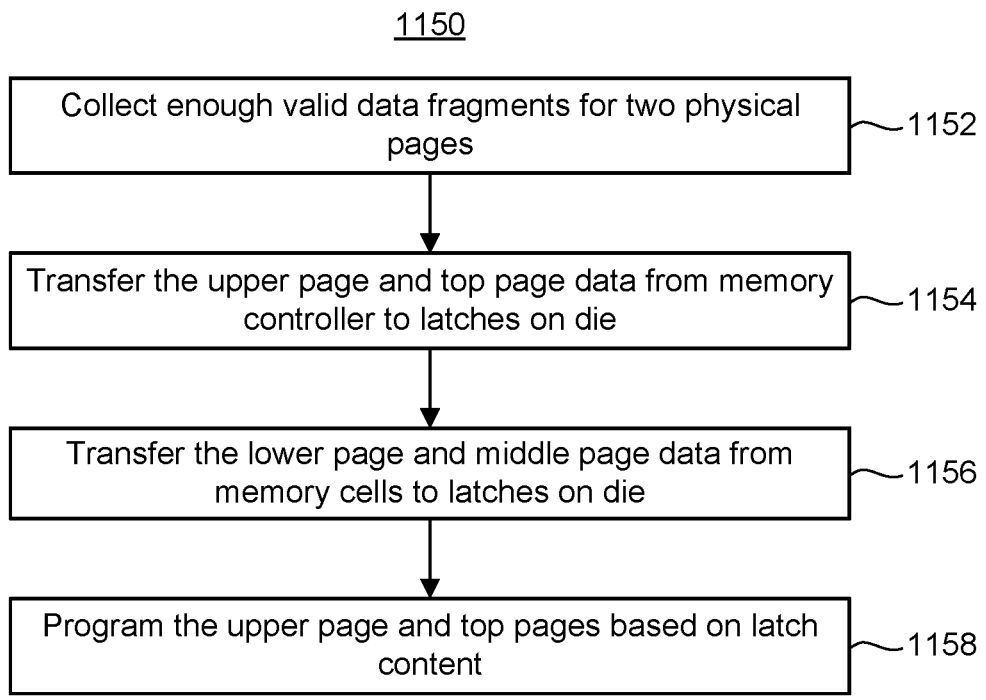
FIG. 11B is a flowchart depicting further details of one embodiment of a process of programming two data pages into a physical page of memory cells during a second-stage of multi-stage data compaction.

FIG. 11B is a flowchart depicting further details of one embodiment of a process 1150 of programming two data pages into a physical page of memory cells during a second-stage of multi-stage data compaction. The process 1150 may be used in an embodiment of step 1024 of process 1000.

Step 1152 includes collecting enough valid data fragments for two data pages. The valid data fragments may be collected in a data buffer (e.g., local memory 140) of the memory controller 120.

Step 1154 includes transferring the two data pages from the data buffer of the memory controller 120 to data latches on the memory die 200 or control die 211. The valid data may be transferred from local memory 140 to memory interface 160. In some embodiments, the valid data is transferred by way of I/O interface 332 to the XDL latches 348. Then, the two data pages may be transferred to the CDL and DDL latches in the set of latches 340. In one embodiment, the latches 340 do not include a DDL latch for the top data page. Instead the XDL latches 348 may be used to store the top data page when programming four data pages.

Step 1156 includes transferring the lower page and the middle page of data from the physical page of memory cells to latches in the die. Step 1156 may be performed under control of the state machine 262. In one embodiment step 1156 includes performing what is referred to herein as an "internal data load (IDL)." In the IDL, the system control logic 260 senses the physical pages of memory cells. Based on results of the sensing, the first valid data is stored in the ADL and BDL latches. For example, the lower page data from step 1106 in process 1100 is internally loaded into the ADL latches and the middle page data from step 1106 in process 1100 is internally loaded into the BDL latches. Therefore, the memory controller 120 need not store or provide the lower page data or the middle page data in the second data compaction stage. Therefore, the amount of memory in the controller's data buffer (e.g., local memory 140) is reduced. Hence, the two-stage data compaction makes efficient use of the memory controller's data buffer.

Step 1158 includes programming the upper page and the top page based on the data latch content. Step 1158 may be performed under control of the state machine 262. Note that the upper page data may be stored in the CDL latches and the top page data may be stored in the DDL latches. In one embodiment, the latches 340 do not include a DDL latch for the top data page. Instead the XDL latches 348 may be used to store the top data page when programming four data pages. Note that the content in the ADL and BDL latches may be relevant in determining to which data state (e.g., S0-S15) each respective memory should be programmed. Process 1150 may then be repeated to program upper pages and top pages into other physical pages in the destination erase block.

In view of the foregoing, a first embodiment includes an apparatus comprising one or more control circuits configured to connect to a three-dimensional memory structure comprising a plurality of erase blocks. Each erase block comprises physical pages of memory cells. The one or more control circuits are configured to read first valid data from one or more source erase blocks that store data at n bits per memory cell, wherein n is a positive integer greater than 1. The one or more control circuits are configured to program the first valid data as m bits per memory cell in a set of the physical pages of memory cells in a destination erase block, wherein m is a positive integer less than n. The one or more control circuits are configured to read second valid data from the one or more source erase blocks. The one or more control circuits are configured to program the second valid data in the set of the physical pages of memory cells in the destination erase block after programming the first valid data in the set of the physical pages such that the memory cells in the set of the physical pages in the destination erase block each store n bits per memory cell.

In a second embodiment, in furtherance to the first embodiment, the one or more control circuits are further configured to free a particular source erase block in response to all of the first valid data from the particular source erase block being programmed to the destination erase block. The particular source erase block is freed prior to programming any of the second valid data in the destination erase block.

In a third embodiment, in furtherance to the first or second embodiments, the one or more control circuits are configured to program n-m data pages of the second valid data into a particular physical page of the memory cells in the destination erase block such that each memory cell of the particular physical page stores n bits by: performing an internal data load of m bits per memory cell of the first valid data to first data latches that contain m data latches per memory cell; collecting enough of the second valid data from the one or more source erase blocks for the n-m data pages into a data buffer; transferring the n-m data pages of the second valid data from the data buffer to second data latches associated with the particular physical page of the memory cells; and programming the n-m data pages of the second valid data into the particular physical page of the memory cells in the destination erase block based on content of the first data latches and the second data latches.

In a fourth embodiment, in furtherance to any of the first to third embodiments, the one or more control circuits are configured to program m data pages of the first valid data into the particular physical page of the memory cells in the destination erase block such that each memory cell in the particular physical page stores m bits by: collecting enough of the first valid data from the one or more source erase blocks for the m data pages into the data buffer; transferring the m data pages of the first valid data from the data buffer to data latches associated with the particular physical page of the memory cells; and programming the m data pages of first valid data in the particular physical page of the memory cells in the destination erase block based on the content of the data latches.

In a fifth embodiment, in furtherance the any of the first to fourth embodiments, the apparatus comprises a memory controller comprising the data buffer. The apparatus comprises a semiconductor die communicatively coupled to the memory controller. The semiconductor die comprises the three-dimensional memory structure, the first data latches, and the second data latches. The memory cells are NAND memory cells.

In a sixth embodiment, in furtherance the any of the first to fourth embodiments, the apparatus comprises a memory controller comprising the data buffer. The apparatus comprise a first semiconductor die communicatively coupled to the memory controller, wherein the first semiconductor die comprises the first data latches and the second data latches. The apparatus comprise a second semiconductor die communicatively coupled to the first semiconductor die, wherein the second semiconductor die comprises the three-dimensional memory structure. The memory cells are NAND memory cells.

In a seventh embodiment, in furtherance of any of the first to the sixth embodiments, the one or more control circuits are configured to read control information for units of data from the memory cells in the one or more source erase blocks; determine which of the units of data in the one or more source erase blocks are valid data based on the control information; include in the first valid data and the second valid data those units of data having valid data; and exclude from the first valid data and the second valid data those units of data determined to have no valid data.

In an eighth embodiment, in furtherance to any of the first to seventh embodiments, n is 4. and m is 2.

In a ninth embodiment, in furtherance to any of the first to the eighth embodiments, the one or more control circuits are configured program all of the physical pages in the destination erase block with the first valid data at n bits per memory cell prior to programming the second valid data into the memory cells in the destination erase block.

One embodiment includes a method for operating a three-dimensional memory structure having erase blocks having physical pages of NAND memory cells. The method comprises collecting first valid data fragments from one or more source erase blocks into a data buffer of a memory controller. The one or more source erase blocks contain the first valid data fragments and invalid data fragments. The physical pages of NAND memory cells in the one or more source erase blocks each store four pages of data. The method comprises programming the first valid data fragments from the data buffer into the physical pages of NAND memory cells in a destination erase block, including programming each respective physical page of NAND memory cells with two data pages of the first valid data fragments. The method comprises collecting second valid data fragments from the one or more source erase blocks into the data buffer of the memory controller. The method comprises programming the second valid data fragments from the data buffer into the physical pages of NAND memory cells in the destination erase block, including programming each respective physical page of NAND memory cells that was programmed with two data pages of the first valid data fragments with two additional data pages of the second valid data fragments. Each respective physical page of NAND memory cells in the destination erase block stores four data pages of valid data from the one or more source erase blocks.

One embodiment includes a non-volatile storage system comprising a three-dimensional memory structure comprising NAND strings. The three-dimensional memory structure is arranged as erase blocks. Each erase block comprises a plurality of physical pages of NAND memory cells. The non-volatile storage system comprises first stage data compaction means for collecting first valid data fragments from one or more source erase blocks, wherein the one or more source erase blocks contain the first valid data fragments and invalid data fragments. The physical pages of NAND memory cells in the one or more source erase blocks each store four pages of data. The first stage data compaction means is further for programming the first valid data fragments into the plurality of the physical pages of NAND memory cells in a destination erase block, including programming each respective physical page of NAND memory cells with two pages of the first valid data fragments. The non-volatile storage system comprises second stage data compaction means for collecting second valid data fragments from the one or more source erase blocks. The second stage data compaction means is further for programming the second valid data fragments into the plurality of the physical pages of NAND memory cells in the destination erase block after programming the first valid data fragments into the plurality of the physical pages in the destination erase block, including programming each respective physical page in the destination erase block with two additional pages of the second valid data fragments. Each respective physical page in the destination erase block stores four pages of valid data from the one or more source erase blocks.

In an embodiment, the first stage data compaction means comprises one or more of memory controller 120, processor 156, ECC engine 158, memory interface 160, local memory controller 164, system control logic 260, state machine 262, column control circuitry 210, row control circuitry 220, an FPGA, an ASIC, and/or an integrated circuit. In one embodiment, the first stage data compaction means performs steps 902 and 904 of process 900. In one embodiment, the first stage data compaction means performs steps 1002-1017 of process 1000. In one embodiment, the first stage data compaction means performs process 1100.

In an embodiment, the second stage data compaction means comprises one or more of memory controller 120, processor 156, ECC engine 158, memory interface 160, local memory controller 164, system control logic 260, state machine 262, column control circuitry 210, row control circuitry 220, an FPGA, an ASIC, and/or an integrated circuit. In one embodiment, the second stage data compaction means performs steps 908 and 910 of process 900. In one embodiment, the second stage data compaction means performs steps 1018-1033 of process 1000. In one embodiment, the second stage data compaction means performs process 1150.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a three-dimensional memory structure comprising a plurality of erase blocks, each erase block comprising physical pages of memory cells, wherein the one or more control circuits are configured to:
   read first valid data from one or more source erase blocks that store data at n bits per memory cell, wherein n is a positive integer greater than 1;
   program the first valid data as m bits per memory cell in a plurality of physical pages of memory cells in a destination erase block, wherein m is a positive integer less than n;
   read second valid data from the one or more source erase blocks;
   transfer the first valid data, physical page-by-physical page, from the plurality of physical pages of memory cells in the destination erase block to first data latches associated with the destination erase block;
   transfer the second valid data, physical page-by-physical page, to second data latches associated with the destination erase block; and
   program the second valid data into the plurality of the physical pages of memory cells in the destination erase block physical page-by-physical page based on contents of the first data latches and the second data latches after programming the first valid data into the plurality of the physical pages such that the memory cells in the plurality of the physical pages in the destination erase block each store n bits per memory cell.

2. The apparatus of claim 1, wherein the one or more control circuits are further configured to:
   free a particular source erase block in response to all of the first valid data from the particular source erase block being programmed to the destination erase block, wherein the particular source erase block is freed prior to programming any of the second valid data in the destination erase block.

3. The apparatus of claim 1, wherein:
   transferring the first valid data, physical page-by-physical page, from the plurality of physical pages of memory cells in the destination erase block to the first data latches associated with the destination erase block includes, for each particular physical page, performing an internal data load of m bits per memory cell of the first valid data to the first data latches that contain m data latches per memory cell;
   transferring the second valid data, physical page-by-physical page, to the second data latches associated with the destination erase block includes, for each particular physical page:
   i) collecting enough of the second valid data from the one or more source erase blocks for n-m data pages into a data buffer; and
   ii) transferring the n-m data pages of the second valid data from the data buffer to the second data latches associated with the destination erase block; and
   programming the second valid data into the plurality of the physical pages of memory cells in the destination erase block physical page-by-physical page based on contents of the first data latches and the second data latches includes, for each particular physical page, programming the n-m data pages of the second valid data into the particular physical page of the memory cells in the destination erase block based on content of the first data latches and the second data latches.

4. The apparatus of claim 3, wherein the one or more control circuits are configured to program m data pages of the first valid data into the particular physical page of the memory cells in the destination erase block such that each memory cell in the particular physical page stores m bits by:
    collecting enough of the first valid data from the one or more source erase blocks for the m data pages into the data buffer;
    transferring the m data pages of the first valid data from the data buffer to the first data latches associated with the destination erase block; and
    programming the m data pages of first valid data in the particular physical page of the memory cells in the destination erase block based on the content of the data latches.

5. The apparatus of claim 3, further comprising:
a memory controller comprising the data buffer; and
a semiconductor die communicatively coupled to the memory controller, wherein the semiconductor die comprises the three-dimensional memory structure, the first data latches, and the second data latches, wherein the memory cells are NAND memory cells.

6. The apparatus of claim 3, further comprising:
a memory controller comprising the data buffer;
a first semiconductor die communicatively coupled to the memory controller, wherein the first semiconductor die comprises the first data latches and the second data latches; and
a second semiconductor die communicatively coupled to the first semiconductor die, wherein the second semiconductor die comprises the three-dimensional memory structure, wherein the memory cells are NAND memory cells.

7. The apparatus of claim 1, wherein the one or more control circuits are configured to:
    read control information for units of data from the memory cells in the one or more source erase blocks;
    determine which of the units of data in the one or more source erase blocks are valid data based on the control information;
    include in the first valid data and the second valid data those units of data having valid data; and
    exclude from the first valid data and the second valid data those units of data determined to have no valid data.

8. The apparatus of claim 1, wherein:
n is 4; and
m is 2.

9. The apparatus of claim 1, wherein the one or more control circuits further are configured to:
    program all of the physical pages in the destination erase block with the first valid data at n bits per memory cell prior to programming the second valid data into the memory cells in the destination erase block.

10. A method for operating a three-dimensional memory structure having erase blocks having physical pages of NAND memory cells, the method comprising:
    collecting first valid data fragments from one or more source erase blocks into a data buffer of a memory controller, wherein the one or more source erase blocks contain the first valid data fragments and invalid data fragments, wherein the physical pages of NAND memory cells in the one or more source erase blocks each store four pages of data;
    programming the first valid data fragments from the data buffer into the physical pages of NAND memory cells in a destination erase block, including programming each respective physical page of NAND memory cells with two data pages of the first valid data fragments;
    collecting second valid data fragments from the one or more source erase blocks into the data buffer of the memory controller; and
    programming the second valid data fragments from the data buffer into the physical pages of NAND memory cells in the destination erase block, including programming each respective physical page of NAND memory cells that was programmed with two data pages of the first valid data fragments with two additional data pages of the second valid data fragments by:
        performing an internal data load of two data pages of the first valid data fragments from the respective physical page in the destination erase block to first data latches associated with the respective physical page;
        transferring two data pages of the second valid data fragments from the data buffer of the memory controller to second data latches associated with the respective physical page; and
        programming the two data pages of the second valid data fragments based on content of the first data latches and the second data latches, wherein each respective physical page of NAND memory cells in the destination erase block stores four data pages of valid data from the one or more source erase blocks.

11. The method of claim 10, further comprising:
    freeing a source erase block in response to all of the first valid data fragments from the source erase block being programmed to the destination erase block, wherein the source erase block is freed prior to programming any of the second valid data fragments in the destination erase block.

12. The method of claim 10, wherein:
    programming each respective physical page of NAND memory cells with two data pages of the first valid data fragments comprises programming a lower data page and a middle data page into each respective physical page of NAND memory cells in the destination erase block; and
    programming each respective physical page of NAND memory cells with two additional data pages of the second valid data fragments comprises programming an upper data page and a top data page into each respective physical page of NAND memory cells in the destination erase block.

13. The method of claim 10, wherein programming the first valid data fragments into a particular physical page of NAND memory cells in the destination erase block comprises:
    transferring two data pages of the first valid data fragments from the data buffer of the memory controller to the first data latches associated with the particular physical page of the memory cells; and
    programming the two data pages of first valid data fragments in the particular physical page of the memory cells in the destination erase block based on content of the first data latches.

14. The method of claim 10, further comprising:
    reading control information for the data fragments from the NAND memory cells in the one or more source erase blocks;
    determining which of the data fragments in the one or more source erase blocks are valid data based on the control information;
    including in the first valid data fragments and the second valid data fragments those data fragments having valid data; and excluding from the first valid data fragments and the second valid data fragments those data fragments determined to have no valid data.

15. A non-volatile storage system comprising:
a three-dimensional memory structure comprising NAND strings, the three-dimensional memory structure arranged as erase blocks, each erase block comprising a plurality of physical pages of NAND memory cells;
first stage data compaction means for collecting first valid data fragments from one or more source erase blocks, wherein the one or more source erase blocks contain the first valid data fragments and invalid data fragments, wherein physical pages of NAND memory cells in the one or more source erase blocks each store four pages of data, wherein the first stage data compaction means is further for programming the first valid data fragments into the plurality of the physical pages of NAND memory cells in a destination erase block, including programming each respective physical page of NAND memory cells with two pages of the first valid data fragments; and
second stage data compaction means for collecting second valid data fragments from the one or more source erase blocks, wherein the second stage data compaction means is further for programming the second valid data fragments into the plurality of the physical pages of NAND memory cells in the destination erase block after programming the first valid data fragments into the plurality of the physical pages in the destination erase block, including programming each respective physical page in the destination erase block with two additional pages of the second valid data fragments, wherein each respective physical page in the destination erase block stores four pages of valid data from the one or more source erase blocks, wherein the second stage data compaction means is further for loading the two pages of the first valid data fragments from each respective physical page of memory cells to first data latches associated with the physical pages of the memory cells, transferring the two additional pages of the second valid data fragments from a data buffer of a memory controller to second data latches associated with the physical pages, and programming the two additional pages of second valid data fragments in each respective physical page of the memory cells based on content of the first data latches and the second data latches.

16. The non-volatile storage system of claim 15, wherein the first stage data compaction means is further for freeing any source erase block for which all first valid data fragments have been programmed to the destination erase block, wherein the source erase block is freed prior to the second stage data compaction means programming any of the second valid data fragments into the destination erase block.

17. The non-volatile storage system of claim 15, wherein the first stage data compaction means is further for collecting into the data buffer a sufficient amount of the first valid data fragments to program two data pages, transferring the two data pages of the first valid data from the data buffer to the first data latches, and programming the two data pages of first valid data fragments into a physical page of the memory cells in the destination erase block.

18. The non-volatile storage system of claim 15, wherein:
the first stage data compaction means is further for correcting any errors in the first valid data fragments prior to programming the first valid data fragments into memory cells in the destination erase block; and
the second stage data compaction means is further for correcting any errors in the second valid data fragments prior to programming the second valid data fragments into memory cells in the destination erase block.

* * * * *